US 8,589,466 B2

(12) United States Patent  (10) Patent No.: US 8,589,466 B2
Lablans  (45) Date of Patent: *Nov. 19, 2013

(54) TERNARY AND MULTI-VALUE DIGITAL SIGNAL SCRAMBLERS, DECRAMBLERS AND SEQUENCE GENERATORS

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 289 days.

This patent is subject to a terminal disclaimer.

(21) Appl. No.: 13/027,387

(22) Filed: Feb. 15, 2011

(65) Prior Publication Data

US 2011/0170697 A1 Jul. 14, 2011

Related U.S. Application Data

(63) Continuation of application No. 11/618,986, filed on Jan. 2, 2007, now abandoned, which is a continuation-in-part of application No. 10/935,960, filed on Sep. 8, 2004, now Pat. No. 7,643,632.

(60) Provisional application No. 60/547,683, filed on Feb. 25, 2004.

(51) Int. Cl.
*G06F 15/00* (2006.01)

(52) U.S. Cl.
USPC .......................................... 708/493; 708/492

(58) Field of Classification Search
USPC .................................. 708/491–493
See application file for complete search history.

(56) References Cited

U.S. PATENT DOCUMENTS

| | | | |
|---|---|---|---|
| 3,129,340 A | 4/1964 | Baskin |
| 3,142,037 A | 7/1964 | Gazale |
| 3,210,529 A | 10/1965 | Hanson |
| 3,283,256 A | 11/1966 | Hurowirz |
| 3,492,496 A | 1/1970 | Callan |
| 3,500,061 A | 3/1970 | Rudolph |
| 3,515,805 A | 6/1970 | Fracassi et al. |
| 3,586,022 A | 6/1971 | Bauer |
| 3,649,915 A | 3/1972 | Mildonian |
| 3,656,117 A | 4/1972 | Maley et al. |
| 3,660,678 A | 5/1972 | Maley et al. |
| 3,663,837 A | 5/1972 | Epstein et al. |
| 3,671,764 A | 6/1972 | Maley et al. |
| 3,718,863 A | 2/1973 | Fletcher et al. |
| 3,760,277 A | 9/1973 | Whang |
| 3,988,538 A | 10/1976 | Patten |
| 3,988,676 A | 10/1976 | Whang |

(Continued)

OTHER PUBLICATIONS

"USPTO Non-Final Office Action mailed Jun. 12, 2009", U.S. Appl. No. 12/339,419, filed Dec. 19, 2008, 10 pages.

(Continued)

*Primary Examiner* — Tan V. Mai

(57) ABSTRACT

Reversible and self reversing multi-value scrambling functions created by applying multi-value inverters are disclosed. The generation of possible multi-value inverters is also presented. Corresponding multi-value descrambling functions are also disclosed. The multi-value functions are used in circuits that scramble and descramble multi-value signals. The multi-value functions can also be used in signal generators. Such signal generators do not require the use of multipliers. The auto-correlation of the signals generated by the signal generators is also presented. Electronic circuits that implement the multi-value functions are also described.

20 Claims, 43 Drawing Sheets

(56) References Cited

U.S. PATENT DOCUMENTS

| | | | |
|---|---|---|---|
| 4,162,480 A * | 7/1979 | Berlekamp | 708/492 |
| 4,304,962 A | 12/1981 | Fracassi et al. | |
| 4,378,595 A | 3/1983 | Current | |
| 4,383,322 A | 5/1983 | Halpern et al. | |
| 4,775,984 A | 10/1988 | Jaffre et al. | |
| 4,808,854 A | 2/1989 | Reinagel | |
| 4,815,130 A | 3/1989 | Lee | |
| 4,984,192 A | 1/1991 | Flynn | |
| 4,990,796 A | 2/1991 | Olson | |
| 5,017,817 A | 5/1991 | Yamakawa | |
| 5,230,003 A | 7/1993 | Dent et al. | |
| 5,412,687 A | 5/1995 | Sutton et al. | |
| 5,563,530 A | 10/1996 | Frazier | |
| 5,621,580 A | 4/1997 | Cruz et al. | |
| 5,714,892 A | 2/1998 | Bowers et al. | |
| 5,724,383 A | 3/1998 | Gold et al. | |
| 5,745,522 A | 4/1998 | Heegard | |
| 5,761,239 A | 6/1998 | Gold et al. | |
| 5,790,265 A | 8/1998 | Shikakura | |
| 5,790,591 A | 8/1998 | Gold et al. | |
| 5,856,980 A | 1/1999 | Doyle | |
| 5,917,914 A | 6/1999 | Shaw et al. | |
| 5,959,871 A | 9/1999 | Pierzchala et al. | |
| 5,978,412 A | 11/1999 | Takai | |
| 5,999,542 A | 12/1999 | Turner et al. | |
| 6,122,376 A | 9/2000 | Rao | |
| 6,133,753 A | 10/2000 | Thomson et al. | |
| 6,133,754 A | 10/2000 | Olson | |
| 6,192,257 B1 | 2/2001 | Ray | |
| 6,320,897 B1 | 11/2001 | Fattouche et al. | |
| 6,430,246 B1 | 8/2002 | Ozluturk | |
| 6,452,958 B1 | 9/2002 | van Nee | |
| 6,463,448 B1 | 10/2002 | Mo | |
| 6,477,205 B1 | 11/2002 | Doblar et al. | |
| 6,519,275 B2 | 2/2003 | Callaway et al. | |
| 6,763,363 B1 | 7/2004 | Driscoll | |
| 6,907,062 B2 | 6/2005 | Carlson | |
| 7,177,424 B1 | 2/2007 | Furuya et al. | |
| 7,412,057 B2 | 8/2008 | Dagan et al. | |
| 2002/0054682 A1 | 5/2002 | Di Bernardo et al. | |
| 2002/0089364 A1 | 7/2002 | Goldgeisser et al. | |
| 2003/0072449 A1 | 4/2003 | Myszne | |
| 2003/0099359 A1 | 5/2003 | Hui | |
| 2003/0123389 A1 | 7/2003 | Russell et al. | |
| 2003/0165184 A1 | 9/2003 | Welborn et al. | |
| 2004/0021829 A1 | 2/2004 | Griffin | |
| 2004/0032918 A1 | 2/2004 | Shor et al. | |
| 2004/0032949 A1 | 2/2004 | Forest | |
| 2004/0037108 A1 | 2/2004 | Notani | |
| 2004/0042702 A1 | 3/2004 | Akimoto | |
| 2004/0068164 A1 | 4/2004 | Diab et al. | |
| 2004/0085937 A1 | 5/2004 | Noda | |
| 2004/0091106 A1 | 5/2004 | Moore et al. | |

OTHER PUBLICATIONS

Rogers, Derek P., "Non-Binary Spread-Spectrum Multiple-Access Communications", Derek Rogers, Ph. D. Thesis, 213 pages, The University of Adelaide, Faculty of Engineering, Adelaide, Australia, Mar. 1995., (Mar. 1995), 213 pgs.

Mathworks, "Communications Blockset Descrambler", http://wvvw.mathworks.de/access/helpdesk_r13/help/toolbox/commblks/ref/descrambler.html, website,(1994-2007).

Mathworks, "Communications Blockset Scrambler", http://www.mathworks.de/access/helpdesk_r13/help/toolbox/commblks/ref/scrambler.html, (before 2003), 1-2.

Mathworks, "Descrambler Blocks (Communications Blockset)" *Matlab 7.1.0 R14 Help Screen*, (2005).

Selected pages from Communications Blockset for use with Simulink, Reference, version 2, 2002, The Mathworks, 11 pages, Natick, MA 01760-2098, dowloaded from Internet.

"USPTO Final Office Action mailed Apr. 1, 2009", U.S. Appl. No. 10/935,960, filed Sep. 8, 2004, 17 pgs.

Wicker, Stephen "Error Control Systems for Digital Communication and Storage", Prentice Hall (1995) pp. 109-121.

Sklar, Bernard "Reed-Solomon Codes", Downloaded from URL http://www.informit.com/content/images/art_sklar7_reed-solomon/elementLinks/art_sklar7_reed-solomon.pdf, (unknown pub date), pp. 1-33.

* cited by examiner

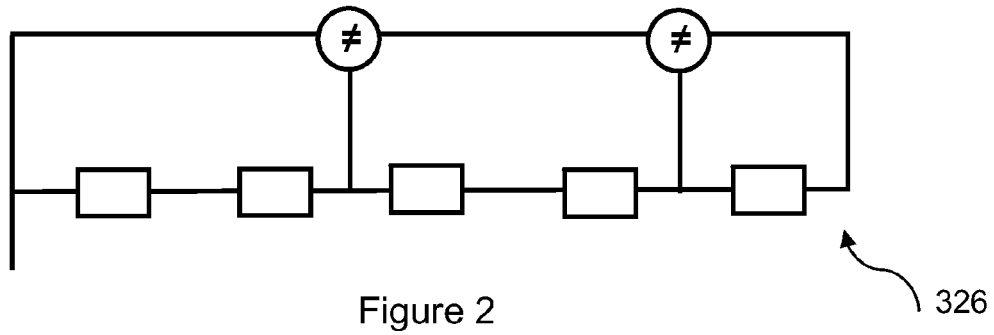
Figure 2
```
S | 0  1
--+------
0 | 0  1
1 | 0  1
```
Figure 3
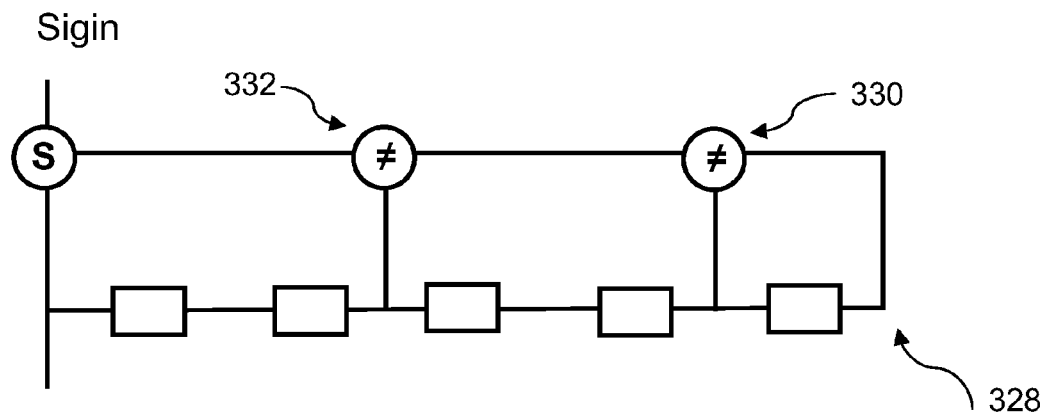
Figure 4

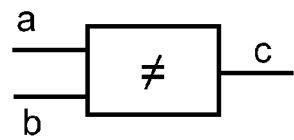
Figure 5
```
XOR | 0  1
----+------
 0  | 0  1
 1  | 1  0
```
Figure 6
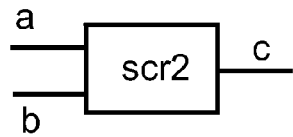
Figure 7
```
scr2 | 0  1  2
-----+---------
  0  | 2  1  0
  1  | 1  0  2
  2  | 0  2  1
```
Figure 8

| scr2 | 0 | 1 | 2 |
|---|---|---|---|
| 0 | 2 | 1 | 0 |
| 1 | 1 | 0 | 2 |
| 2 | 0 | 2 | 1 |

| scr3 | 0 | 1 | 2 |
|---|---|---|---|
| 0 | 1 | 0 | 2 |
| 1 | 0 | 2 | 1 |
| 2 | 2 | 1 | 0 |

| scr5 | 0 | 1 | 2 |
|---|---|---|---|
| 0 | 0 | 2 | 1 |
| 1 | 2 | 1 | 0 |
| 2 | 1 | 0 | 2 |

Figure 9

| scr | 0 | 1 | 2 | ... | ... | m |
|---|---|---|---|---|---|---|
| 0 | 0 | m | m-1 | ... | ... | 1 |
| 1 | m | m-1 | m-2 | ... | 1 | 0 |
| 2 | ... | ... | ... | 1 | 0 | ... |
| ... | ... | ... | 1 | 0 | ... | ... |
| ... | 2 | 1 | 0 | ... | ... | 3 |
| m | 1 | 0 | m | ... | ... | 2 |

Figure 10

| ternary inverters | i1 | i2 | i3 | i4 | i5 | i6 |
|---|---|---|---|---|---|---|
| 0 | 0 | 0 | 1 | 1 | 2 | 2 |
| 1 | 1 | 2 | 0 | 2 | 0 | 1 |
| 2 | 2 | 1 | 2 | 0 | 1 | 0 |

Figure 11

|   | i1 | i2 | i3 | i4 |
|---|---|---|---|---|
| 0 | x | a | p | k |
| 1 | y | b | q | l |
| 2 | z | c | r | m |

| scr | 0 | 1 | 2 |
|---|---|---|---|
| 0 | p | a | a |
| 1 | q | b | b |
| 2 | r | c | c |

Figure 12

| scr3_a | 0 | 1 | 2 |
|---|---|---|---|
| 0 | 0 | 1 | 2 |
| 1 | 1 | 2 | 0 |
| 2 | 2 | 0 | 1 |

| scr3_b | 0 | 1 | 2 |
|---|---|---|---|
| 0 | 0 | 2 | 1 |
| 1 | 1 | 0 | 2 |
| 2 | 2 | 1 | 0 |

| scri151 | 0 | 1 | 2 |
|---|---|---|---|
| 0 | 0 | 0 | 0 |
| 1 | 1 | 2 | 1 |
| 2 | 2 | 1 | 2 |

| scr4_g | 0 | 1 | 2 | 3 |
|---|---|---|---|---|
| 0 | 0 | 2 | 3 | 1 |
| 1 | 1 | 3 | 2 | 0 |
| 2 | 3 | 0 | 1 | 2 |
| 3 | 2 | 1 | 0 | 3 |

| scr4_e | 0 | 1 | 2 | 3 |
|---|---|---|---|---|
| 0 | 1 | 0 | 2 | 3 |
| 1 | 0 | 3 | 1 | 2 |
| 2 | 2 | 1 | 3 | 0 |
| 3 | 3 | 2 | 0 | 1 |

| scr4_f | 0 | 1 | 2 | 3 |
|---|---|---|---|---|
| 0 | 1 | 0 | 3 | 2 |
| 1 | 0 | 2 | 1 | 3 |
| 2 | 2 | 3 | 0 | 1 |
| 3 | 3 | 1 | 2 | 0 |

| i | 0 | 1 |
|---|---|---|
| 0 | 0 | 0 |
| 1 | 1 | 1 |

| input | | input | | |
|---|---|---|---|---|
| 0 | 0 | 0 | | 0 |
| 1 | x 1 = 1 | 1 | x 2 = | 2 |
| 2 | 2 | 2 | | 1 |

| input | |
|---|---|
| 0 | 0 |
| 1 | 1 |
| 2   x 1 = | 2 |
| 3 | 3 |
| 4 | 4 |

| input | |
|---|---|
| 0 | 0 |
| 1 | 2 |
| 2   x 2 = | 4 |
| 3 | 1 |
| 4 | 3 |

| input | |
|---|---|
| 0 | 0 |
| 1 | 3 |
| 2   x 3 = | 1 |
| 3 | 4 |
| 4 | 2 |

| input | |
|---|---|
| 0 | 0 |
| 1 | 4 |
| 2   x 4 = | 3 |
| 3 | 2 |
| 4 | 1 |

In_1mod

|  mod3+ | 0 | 1 | 2 |
|---|---|---|---|
| 0 | 0 | 1 | 2 |
| In_2  1 | 1 | 2 | 0 |
| 2 | 2 | 0 | 1 |

|  equiv1 | 0 | 1 | 2 |
|---|---|---|---|
| 0 | 0 | 2 | 1 |
| In_2  1 | 1 | 0 | 2 |
| 2 | 2 | 1 | 0 |

| Input | | Output |
|---|---|---|
| 0 | | p |
| 1 | | q |
| 2 | | r |
| 3 | → | s |
| . | | . |
| . | | . |
| n-2 | | t |
| n-1 | | u |

Conducting state

Non-conducting state $$\begin{array}{cc} i_4 & i_4 \\ \hline \begin{vmatrix} 0 \\ 1 \\ 2 \end{vmatrix} \text{inv} \begin{matrix} 1 \\ 2 \\ 0 \end{matrix} = \begin{vmatrix} 1 \\ 2 \\ 0 \end{vmatrix} & \begin{vmatrix} 1 \\ 2 \\ 0 \end{vmatrix} \text{inv} \begin{matrix} 1 \\ 2 \\ 0 \end{matrix} = \begin{vmatrix} 2 \\ 0 \\ 1 \end{vmatrix} \end{array}$$

Figure 51

$$\begin{array}{cc} i_5 & i_5 \\ \hline \begin{vmatrix} 0 \\ 1 \\ 2 \end{vmatrix} \text{inv} \begin{matrix} 2 \\ 0 \\ 1 \end{matrix} = \begin{vmatrix} 2 \\ 0 \\ 1 \end{vmatrix} & \begin{vmatrix} 2 \\ 0 \\ 1 \end{vmatrix} \text{inv} \begin{matrix} 2 \\ 0 \\ 1 \end{matrix} = \begin{vmatrix} 1 \\ 0 \\ 2 \end{vmatrix} \end{array}$$

Figure 52

| ternary | 0 | 1 | 2 |
|---|---|---|---|
| 0 | 2 | 2 | 0 |
| 1 | 0 | 0 | 1 |
| 2 | 1 | 0 | 2 |

Figure 53

$$\left.\begin{array}{l}\text{Sigin} = [0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 0] \\ \text{Sig\_spread\_0} = [1\ 2\ 0\ 0\ 2\ 0\ 2\ 2\ 2\ 1\ 1\ 0\ 2\ 1\ 2\ 0\ 0\ 2\ 0\ 2\ 2\ 2\ 1\ 1\ 0\ 2] \\ \text{Sigin} = [1\ 1\ 1\ 1\ 1\ 1\ 1\ 1\ 1\ 1\ 1\ 1\ 1\ 1\ 1\ 1\ 1\ 1\ 1\ 1\ 1\ 1\ 1\ 1\ 1\ 1\ 1] \\ \text{Sig\_spread\_1} = [0\ 1\ 1\ 0\ 1\ 0\ 0\ 0\ 2\ 2\ 1\ 0\ 2\ 0\ 1\ 1\ 0\ 1\ 0\ 0\ 0\ 2\ 2\ 1\ 0\ 2] \\ \text{Sigin} = [2\ 2\ 2\ 2\ 2\ 2\ 2\ 2\ 2\ 2\ 2\ 2\ 2\ 2\ 2\ 2\ 2\ 2\ 2\ 2\ 2\ 2\ 2\ 2\ 2\ 2\ 2] \\ \text{Sig\_spread\_2} = [2\ 0\ 2\ 0\ 0\ 0\ 1\ 1\ 2\ 0\ 1\ 0\ 2\ 2\ 0\ 2\ 0\ 0\ 0\ 1\ 1\ 2\ 0\ 1\ 0\ 2]\end{array}\right\}$$

| sc4 | 0 | 1 | 2 |
|---|---|---|---|
| 0 | 0 | 1 | 2 |
| 1 | 2 | 0 | 1 |
| 2 | 1 | 2 | 0 |

Figure 63

| sc9 | 0 | 1 | 2 |
|---|---|---|---|
| 0 | 1 | 2 | 0 |
| 1 | 2 | 0 | 1 |
| 2 | 0 | 1 | 2 |

Figure 64

| ds9 | 0 | 1 | 2 |
|---|---|---|---|
| 0 | 2 | 1 | 0 |
| 1 | 0 | 2 | 1 |
| 2 | 1 | 0 | 2 |

Figure 65

TERNARY AND MULTI-VALUE DIGITAL SIGNAL SCRAMBLERS, DECRAMBLERS AND SEQUENCE GENERATORS

STATEMENT OF RELATED CASES

This application is a continuation of U.S. patent application Ser. No. 11/618,986 filed on Jan. 2, 2007 which is a continuation-in-part of U.S. patent application Ser. No. 10/935,960 filed on Sep. 8, 2004, now U.S. Pat. No. 7,643,632, issued Jan. 5, 2010, which claims the benefit of U.S. provisional patent application Ser. No. 60/547,683 filed on Feb. 25, 2004, of which all of the above are incorporated herein by reference in their entirety.

BACKGROUND OF THE INVENTION

This invention relates to the scrambling of multi-value digital (non-binary) signals and the generation of multi-value (non-binary) digital signals consisting of sequences of multi-value (non-binary) digital elements such as n-value pseudo-noise sequences. Multi-value signals, also referred to as x-value signals, can assume one of x states, wherein x is greater than or equal to three.

Its potential application is in telecommunication systems, control systems and other applications. Specific examples of utility where the invention can be used include spread-spectrum technologies, signal scrambling, CDMA, line-coding and scrambling application in video and other signal distribution.

Digital scramblers are used to change the appearance of a digital signal in such a way that during transmission the signal is different from the original signal. The original signal can be recovered from the scrambled signal at the receiving end by a descrambler. Most commonly in today's telecommunications, the scramblers relate to binary signals.

Scrambling of a binary signal can be achieved by combining the binary signal to be scrambled with a second known binary signal through a digital circuit that has the characteristics of a reversible function. The inventor has recognized that the reversible function has the property that its two inputs generate an output. When applying this output as the input to another, but similar, circuit with as the other input a signal similar to the known input of the first digital circuit, the output of the second circuit is identical to the to be scrambled data signal input of the first circuit. This other circuit is a descrambler.

There are two known binary functions that can perform this reversible function: the Exclusive Or (XOR) and the Equal function. The XOR function is also known as the modulo-2 adding function.

Telecommunication markets such as wireless communications and internet communications demonstrate an ongoing increase in demand for higher information transmission rates. This demand in increased information transmission rates in wireless communications is addressed by increasing bandwidth of communication channels, by compression of the information and by moving into much higher radio spectra (such as Ultra Wide Band in the 5 GHz area). Eventually, new technology has to be applied to obtain better performance from existing bandwidth, starting with highly congested spectrum areas. Current transmission technology predominantly uses digital binary signals. One possible technology to provide better bandwidth usage is the application of multi-value digital signals. Scrambling, descrambling and signal sequence generation is an important element of signal processing technology, especially in wireless communications.

However, currently very little technology exists in prior art that can perform multi-value digital scrambling, descrambling and sequence generation. Most of prior art in scrambling, descrambling and sequence generation only performs binary functions, as previously discussed.

Consequently, new and improved methods and apparatus to perform scrambling, descrambling and sequence generation on non-binary, multi-value digital signals are required.

The existence of multi-value reversible logic functions has been previously mentioned. However, no mention has been found of multi-value reversible logic in scrambling/descrambling applications, nor in the generation of multi-value signal sequences.

SUMMARY OF THE INVENTION

In view of the more limited possibilities of the prior art in binary and multi-value scrambling (or reversible) logic functions, the current invention offers an easier design as well as a greater variety in multi-value scramblers and in LFSR based sequence generators. It also provides improved performance.

The general purpose of the present invention, which will be described subsequently in greater detail, is to provide new scrambler/descrambler systems and LFSR based generators of multi-value signal sequences. It also provides a new electronic circuit and gates to process multi-value signals, and provides sequence generators with reduced component and count.

Before explaining at least one embodiment of the invention in detail it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

Multi-value and n-value in the context of this application mean a number n, with n being a positive integer greater than two.

A primary object of the present invention is to provide new multi-value scrambler/descrambler systems that will overcome the shortcomings of the prior art devices.

An object of the present invention is to provide a maximum set of multi-value digital, single function, scrambling/descrambling devices.

Another object is to provide new LFSR based multi-value digital scramblers and self synchronizing LFSR based descrambler devices.

Another object is to provide a method for applying multi-value logic scrambling/descrambling functions in a LFSR architecture to generate multi-value digital signal sequences.

Another object of the invention is to provide n-Value LFSR based scramblers/descramblers as n-value signal spreaders/despreaders with no synchronization requirements. As is known, these are easier to realize, but provide less security.

Another object of the invention is to provide n-Value LFSR based scramblers/descramblers as n-value signal spreaders/despreaders with synchronization requirements. As is known, these are harder to realized, but provide higher security.

Another object is to provide multi-value digital inverters that will change the value of a multi-value signal without upsetting the distinguishing characteristics of the individual elements of a digital signal.

Another object is to provide composite systems comprising two or more individual systems that are connected through components that execute multi-value logic digital scrambling functions.

Another object is to provide a method called "design by inverters" that allows creating any multi-value truth table for scrambling and descrambling functions from a set of individual multi-value digital inverters.

Another object of the invention is to provide a method to translate prior art modulo-n adder functions combined with n-value multipliers at the inputs into n-value scrambling functions of this invention.

Another object of the invention is to apply multi-value logic reversible inverters to received signals in order to bring desired auto-correlation and cross-correlation levels of the signals to zero.

Another object of the invention is to provide a method for creating multi-value logic devices of which the scrambling functions are a subset, by applying components which only consist of the following types: a gate and a universal multi-value inverter.

Prior art in scrambling/descrambling and signal sequence generation mainly applies binary technology. Even in cases where multi-value digital signals are generated the scrambling, descrambling and sequence generation is based on modulo-2 theory and embodiment. In some cases modulo-n addition theory and embodiment is proposed. However modulo-n addition is a non-self reversing technology. As such modulo-n addition requires a reversing function to create a n-value scrambler/descrambler set. Also modulo-n addition solution in creating LFSR based scramblers, descramblers and sequence generators require multipliers to achieve statistically optimal performance.

Consequently the present invention offers a much broader, more diverse and easier method to create multi-value scramblers, descramblers and signal sequence generators. Combined with prior art in realizing multi-value logic electronic embodiments this invention can prevent the need for "switching back to binary logic" in multi-value logic signal processing applications. Prior art such as realizing adequate 4B3T transmission signals demonstrates the overhead from binary logic to manage ternary (3-value) signal generation and recovery with binary logic circuitry.

One aspect of the present invention provides multi-value functions, including ternary and higher multi-value functions, that are useful in many applications, including those requiring scrambling, descrambling, spreading, dispreading and sequence generation.

In accordance with one aspect of the present invention, a method of scrambling a ternary signal with a scrambler is provided. The ternary signal is able to assume one of three states and the scrambler has a first scrambling ternary logic device that implements a ternary logic function, sc, and a scrambling logic circuit. The method involves inputting the ternary signal and an output from the scrambling logic circuit to the first scrambling ternary logic device and inputting an output from the first scrambling ternary logic device to the scrambling logic circuit. The ternary logic function, sc, can be specified by a scrambling ternary truth table having three columns, and each of the columns being defined by a ternary inverter. When the ternary signal is input, the output from the first scrambling ternary logic device is a scrambled version of the ternary signal.

In accordance with another aspect of the present invention, each column is defined by one of the following ternary inverters $i_1$ to $i_6$:

| | $i_1$ | $i_2$ | $i_3$ | $i_4$ | $i_5$ | $i_6$ |
|---|---|---|---|---|---|---|
| 0 | 0 | 0 | 1 | 1 | 2 | 2 |
| 1 | 1 | 2 | 0 | 2 | 0 | 1 |
| 2 | 2 | 1 | 2 | 0 | 1 | 0 |

It is noted, however, that every column cannot be defined by the identity inverter $i_1$. In that case, there would be no scrambling performed.

In accordance with a further aspect of the present invention, at least one ternary inverter can be used to define a scrambling ternary truth table with the exception of the identity inverter, as described in the previous paragraph. Also, more than one ternary inverter can be used to define a scrambling ternary truth table.

In one embodiment of the present invention, the scrambling logic circuit includes a scrambling n-length shift register having n elements and a first and a second scrambling ternary logic device, the scrambling n-length shift register having outputs from two of the n elements that are provided to two inputs of the second scrambling ternary logic device, and wherein the output from the first scrambling ternary logic device is provided to an input of the n-length shift register and an output of the second scrambling ternary logic device is provided to an input of the first scrambling ternary logic device. One of the inputs to the second scrambling ternary logic device is usually from the last element in the n-length shift register. Further, additional ternary logic devices and taps from additional or different elements in the shift register can be used. The ternary logic devices implement a ternary logic function that is defined by ternary inventors.

For example, the scrambling logic circuit could include a scrambling n-length shift register having n elements and at least one second scrambling x-value logic device (where x is greater than or equal to three). There are, at most, n−1 second scrambling x-value logic devices. The n−1 x-value second logic devices can be functionally equivalent or can be different, but each are specified by a x-value scrambling truth table having x columns, each of the x columns being defined by one of x! reversible x-value inverters and wherein not all of the columns are defined by the identity inverter. Each of the n−1 x-value second logic devices has two inputs and one output. One of the inputs of each of the n−1 x-value second logic devices is uniquely connected with an output of an element of the n-length shift register. If there are two or more second logic devices in the scrambling logic circuit then the second logic devices have as their second input the output of the next second logic device, with exception of the last second logic device which has the output of the n-length shift register as is second input. The output of the first (and possibly only) second logic device is the output of the scrambling logic circuit.

In accordance with a further aspect of the present invention, the scrambled version of the ternary signal is descrambled with a descrambling device. The descrambling device is related and similar to the scrambler. The descrambling device has a first descrambling ternary logic device and a descrambling logic circuit. The first descrambling ternary logic device implements a ternary logic function, dc. The method of descrambling includes inputting the scrambled version of the ternary signal to the first descrambling ternary logic device and to the descrambling logic circuit, inputting an output from the descrambling logic circuit to the first descrambling ternary logic device, and outputting a descrambled ternary signal on an output of the first descrambling ternary logic device. The ternary logic function, dc, can be specified by a descrambling ternary truth table having three columns, and each of the columns is defined by one of the ternary inverters $i_1$ to $i_6$.

In accordance with another aspect of the present invention, a column in the descrambling ternary truth table is defined by: (1) the same inverter that defines the corresponding column in the scrambling ternary truth table if the inverter is $i_1$, $i_2$, $i_3$ or $i_6$; (2) the inverter $i_5$ if the corresponding column in the scrambling ternary truth table is defined by the inverter $i_4$; and (3) the inverter $i_4$ if the corresponding column in the scrambling ternary truth table is defined by the inverter $i_5$.

In accordance with another aspect of the present invention, a column in the descrambling ternary truth table is defined by: (1) the same inverter that defines the corresponding column in the scrambling ternary truth table if the inverter is self reversing and (2) a different inverter if the corresponding column in the scrambling ternary truth table is defined by a reversible inverter that is not self-reversing. This also applies to the multi-value case where a signal represents one of four or more values.

In accordance with one embodiment of the present invention, the scrambling logic circuit includes a scrambling n-length shift register having n elements and a second scrambling ternary logic device, the scrambling n-length shift register having outputs from two of the n elements that are provided to two inputs of the second scrambling ternary logic device, and wherein the output from the first scrambling ternary logic device is provided to an input of the n-length shift register and an output of the second scrambling ternary logic device is provided to an input of the first scrambling ternary logic device. The corresponding descrambling logic circuit includes a descrambling n-length shift register having n elements and a second descrambling ternary logic device, the scrambling n-length shift register having outputs from two of the n elements that are provided to two inputs of the second descrambling ternary logic device, and wherein the output from the second descrambling ternary logic device is provided to an input of the first descrambling ternary logic device and the scrambled version of the ternary signal is input to the descrambling n-length shift register. The descrambling unit is similar and related to the scrambling unit, having the same length of shift register, output taps at the same positions and applying identical ternary functions.

In accordance with another aspect of the present invention, apparatus for scrambling a ternary signal that can assume one of three states is provided. The apparatus includes a first scrambling ternary logic device that implements a ternary logic function, sc, the first scrambling ternary logic device having a first and second input and an output. It also includes a scrambling logic circuit having an input and an output. The ternary signal is input to the first input of the first scrambling ternary logic device, the output of the scrambling logic circuit is input to the second input of the first scrambling ternary logic device and the output of the first scrambling ternary logic device is provided to the input of the scrambling logic circuit. The ternary logic function, sc, can be specified by a scrambling ternary truth table having three columns, each of the columns being defined by a ternary inverter. A scrambled ternary signal is provided on the output of the first scrambling ternary logic device.

Apparatus for descrambling ternary signals is also provided in accordance with the present invention. The apparatus for scrambling and descrambling ternary signals corresponds, for the most part, to the previously described method for scrambling and descrambling ternary signals.

The present invention also provides method and apparatus for scrambling and descrambling multi-value signals that can assume one of x states, wherein x is greater than or equal to 4. The scrambler has a first scrambling multi-value logic device that implements a multi-value logic function, fsc, and a scrambling logic circuit. The method involves inputting the multi-value signal and an output from the scrambling logic circuit to the first scrambling multi-value logic device and inputting an output from the first scrambling multi-value logic device to an input to the scrambling logic circuit. The multi-value logic function, fsc, can be specified by a multi-value scrambling truth table having x columns, each of the columns being defined by a multi-value inverter. The output from the first scrambling multi-value logic device is a scrambled version of the multi-value signal.

In the case where x equals 4, each column is defined by one of the following multi-value inverters $i_1$ to $i_{24}$:

| $i_1$ | $i_2$ | $i_3$ | $i_4$ | $i_5$ | $i_6$ | $i_7$ | $i_8$ | $i_9$ | $i_{10}$ | $i_{11}$ | $i_{12}$ | $i_{13}$ | $i_{14}$ | $i_{15}$ | $i_{16}$ | $i_{17}$ | $i_{18}$ | $i_{19}$ | $i_{20}$ | $i_{21}$ | $i_{22}$ | $i_{23}$ | $i_{24}$ |
|---|---|---|---|---|---|---|---|---|---|---|---|---|---|---|---|---|---|---|---|---|---|---|---|
| 0 | 0 | 0 | 0 | 0 | 0 | 0 | 1 | 1 | 1 | 1 | 1 | 1 | 2 | 2 | 2 | 2 | 2 | 2 | 3 | 3 | 3 | 3 | 3 | 3 |
| 1 | 1 | 1 | 2 | 2 | 3 | 3 | 0 | 0 | 2 | 2 | 3 | 3 | 0 | 0 | 1 | 1 | 3 | 3 | 0 | 0 | 1 | 1 | 2 | 2 |
| 2 | 2 | 3 | 1 | 3 | 1 | 2 | 2 | 3 | 0 | 3 | 0 | 2 | 1 | 3 | 0 | 3 | 0 | 1 | 1 | 2 | 0 | 2 | 0 | 1 |
| 3 | 3 | 2 | 3 | 1 | 2 | 1 | 3 | 2 | 3 | 0 | 2 | 0 | 3 | 1 | 3 | 0 | 1 | 0 | 2 | 1 | 2 | 0 | 1 | 0 |

In accordance with one aspect of the present invention, at least one different multi-value inverter defines a multi-value truth table, as long as every column is not defined by the identity inverter for scrambling applications. Alternatively, a greater number of different multi-value inverters can define the multi-value truth table.

Further, the invention is applicable where x is greater than four. There are x! reversible inverters in any x-value logic system.

The scrambling logic circuit for processing the multi-value signal is similar to the scrambling logic circuit for processing the ternary logic signal. It includes a scrambling n-length shift register having n elements and one or more second scrambling multi-value logic device. The scrambling n-length shift register has outputs from two of the n elements that are provided to two inputs of one of the second scrambling multi-value logic device. The output from the first scrambling multi-value logic device is provided to an input of the n-length shift register and an output of the second scrambling multi-value logic device is provided to an input of the first scrambling multi-value logic device. As before, additional logic devices and additional taps can be used.

In accordance with another aspect of the present invention, the scrambled version of the multi-value signal is descrambled with a descrambling device having a first descrambling multi-value logic device and a descrambling logic circuit. The first descrambling multi-value logic device implementing a multi-value logic function, fdc. The method involves inputting the scrambled version of the multi-value signal to the first descrambling multi-value logic device and to the descrambling logic circuit, inputting an output from the descrambling logic circuit to the first descrambling multi-value logic device and outputting a descrambled multi-value signal on an output of the first descrambling multi-value logic device. The multi-value logic function, fdc, can be specified by a descrambling multi-value truth table having x columns, and each of the columns is defined by one of the multi-value inverters $i_1$ to $i_{24}$, if x is equal to 4. Again, the descrambling unit is related and similar to the scrambling unit, as previously described.

In accordance with another aspect of the present invention, a column in the descrambling multi-value truth table is defined by: (1) the same inverter that defines the corresponding column in the scrambling multi-value truth table if the inverter is self reversing; and (2) a different inverter if the corresponding column in the scrambling multi-value truth table is defined by a reversible inverter that is not self-reversing.

In accordance with another aspect of the present invention, a multi-value sequence generator is provided. The sequence generator includes a shift register having a plurality of n elements and one or more (but not more than n−1) multi-value logic devices, each having a first input, a second input and an output. The output from one (but generally not the last) of the plurality of elements is connected to the first input of the first multi-value logic device. If the first multi-value logic device is the only logic device, the output of the last of the plurality of elements is connected to the second input of the multi-value logic device and the output from the first or only multi-value logic device is connected to the input of the first of the plurality of elements. If there are two or more multi-value logic devices in the sequence generator, the second input of the first multi-value logic device is connected with the output of the next multi-value logic device. The next multi-value logic device has two inputs. The first input of the next multi-value logic device is connected with a unique output of the plurality of elements of the shift register (but not with the last one). The second input of the next multi-value logic device is connected with the output of the following multi-value logic device, unless this next multi-value logic device is the final one. In that case its second input is connected with the output of the last element of the plurality of elements of the shift register.

In accordance with another aspect of the present invention an electronic circuit for implementing a ternary logic function is provided. The ternary logic function can be defined by a truth table that has a first column defined by a first ternary inverter, a second column defined by a second ternary inverter and a third column defined by a third ternary inverter. The electronic circuit processes the ternary logic signal and a second input signal, both signals being able to assume a first state, a second state and a third state, such that it implements the ternary logic function defined by the truth table.

The electronic device has a first input port for the ternary logic signal, a second input port for the second input signal and an output. The electronic device also has a first channel including a series connection of the first ternary inverter and first switching means for connecting the first input to the output when the second input signal assumes a first of the three states. This first channel implements the first column of the truth table defining the ternary logic function. It also has a second channel including a series connection of the second ternary inverter and second switching means for connecting the first input to the output when the second input signal assumes a second of the three states. This second channel implements the second column of the truth table defining the ternary logic function. It also has a third channel including a series connection of the third ternary inverter and third switching means for connecting the first input to the output when the second input assumes a third of the three states. The third channel implements the third column of the truth table defining the ternary logic function.

BRIEF DESCRIPTION OF THE DRAWINGS

Various other objects, features and attendant advantages of the present invention will become fully appreciated as the same becomes better understood when considered in conjunction with the accompanying drawings, and wherein:

FIG. 2 is a diagram showing a binary 5-stage Linear Feedback Shift Register (LFSR) based binary sequence generator;

FIG. 3 shows the truth table of a 2 input single output binary function that passes on the value of one input regardless of the value of the other input;

FIG. 4 shows a diagram of a binary 5-stage LFSR based scrambler applying the function described in FIG. 3 to form a binary sequence generator;

FIG. 5 shows the canonical form of a 2 input single output logic device, in this case, depicting a binary XOR or modulo-2 addition device;

FIG. 6 shows the truth table belonging to the 2 input single output XOR device;

FIG. 7 shows a two input ('a' and 'b') single output ('c') ternary logic device scr2;

FIG. 8 shows the ternary logic truth table for device scr2 of FIG. 7;

FIG. 9 shows the truth tables for three self reversing ternary logic functions;

FIG. 10 shows the canonical truth table of the self reversing n-value logic function, in accordance with one aspect of the present invention;

FIG. 11 shows a table of six ternary reversible inverters in accordance with one aspect of the present invention;

FIG. 12 shows a table of a symbolic representation of four (4) self reversing ternary inverters including the identity inverter and also shows a truth table of a self reversing scrambling function;

FIG. 51 shows a table applying ternary inverter i4 once and twice;

FIG. 52 shows a table applying ternary inverter i5 once and twice;

FIG. 53 is the truth table of a ternary function that will be realized in diagram with the gate/universal inverter method;

FIG. 63 shows the truth table of ternary logic function 'sc4';

FIG. 64 shows the truth table of ternary logic function 'sc9';

FIG. 65 shows the truth table for ternary logic function 'ds9';

DETAILED DESCRIPTION OF THE INVENTION

Figure 1:
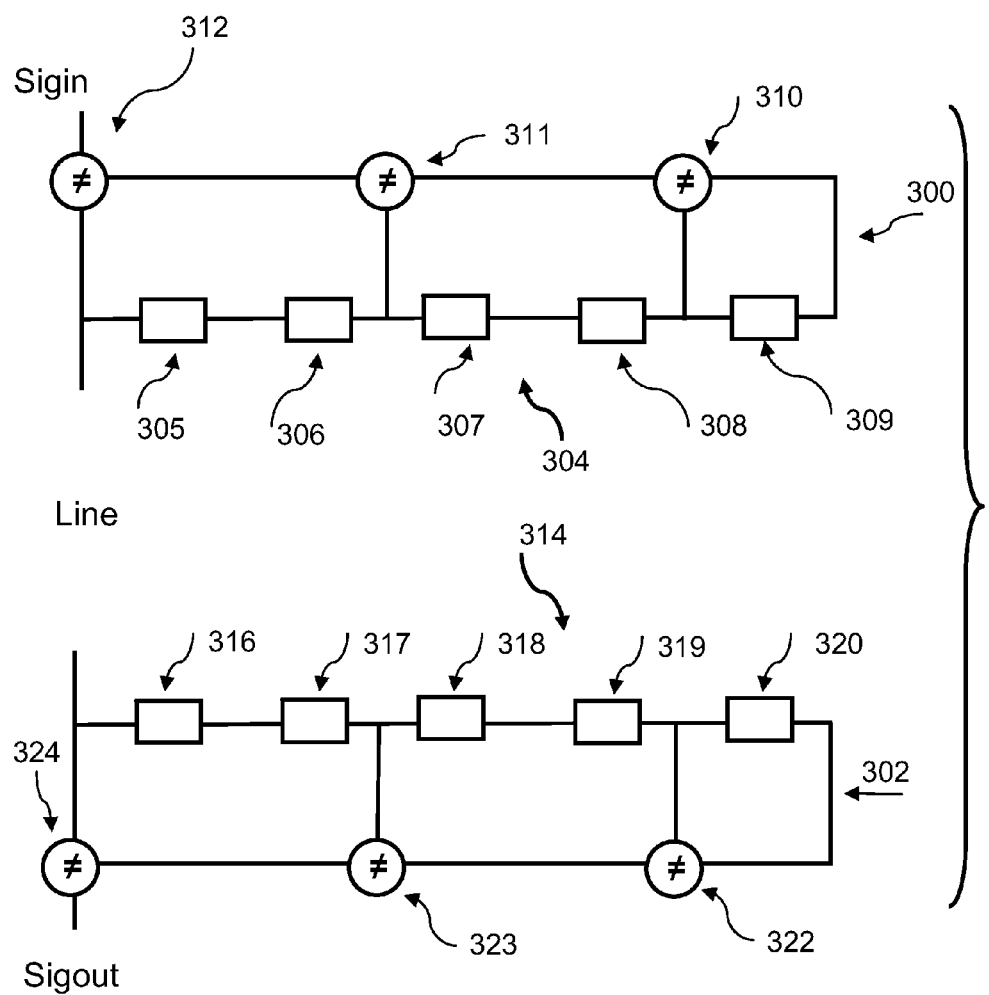
FIG. 1 is a diagram showing a five stage Linear Feedback Shift Register binary scrambler with feedback taps at the output of shift register stage 2, 4 and 5 and a matching binary 5-stage LFSR based descrambler.

The inventor has filed a provisional patent application that has been assigned Ser. No. 60/501,335 that relates to commutative multi-value scrambling/descrambling logic functions. This provisional patent application contains a description of how these functions can be applied in signal scramblers and in LFSR based multi-value scramblers and descramblers. The disclosure, including the entire specification and drawings, in provisional patent application Ser. No. 60/501,335, filed on Sep. 9, 2003, is hereby incorporated by reference in its entirety into this document. Also, the disclosure, including the entire specification and drawings, in non-provisional patent application Ser. No. 10/912,954, filed on Aug. 6, 2004, that claims the benefit of provisional patent application Ser. No. 60/501,335 and is entitled TERNARY AND HIGHER MULTI-VALUE DIGITAL SCRAMBLERS/DESCRAMBLERS, is hereby incorporated by reference in its entirety into this document. Further, the entire disclosure, including the specification and drawings in the provisional patent application Ser. No. 60/547,683, filed Feb. 25, 2004, is hereby incorporated by reference into this document.

While powerful in their own right, the application of the functions described in the aforementioned provisional patent application form a subset of a more elaborate collection of possible functions that are specified in this specification. The increased number of possible functions can provide a greater diversity and thus, among other benefits, a greater security.

Furthermore, in accordance with another aspect of the present invention, a new method referred to as "inverter based design" allows for designing, realizing and enabling commutative as well non-commutative scrambling/descrambling functions. With the "inverter based" scrambling functions, multi-value pseudo-noise signal sequence generators can be created with a multi-value shift register, and these inverter based sequence generators do not require a multiplier. Thus, fewer components are required than previous designs.

Furthermore, in accordance with another aspect of the present invention, the "method of inverters" allows for creating electronic circuits executing multi-value scramblers, descramblers and digital sequence generators by using a limited functional set of components including: a gate and a universal inverter and, if needed, A/D and D/A converters.

In accordance with one aspect of the present invention, the invention can contribute in obtaining better performance from existing bandwidth. For example, ternary and quaternary signals are used in line-coding to obtain a better usage from spectrum bandwidth. Signals are scrambled to avoid long series of constant values of a signal (such as long series of zeros). Usually this involves scrambling of a binary signal followed by coding from binary to multi-value. In accordance with another aspect of the present invention, line-coding is made much less complex.

Spread-spectrum signals can be created by scrambling a slow data signal with a much faster "chip" sequence. The signal can be de-spread, so that the original sequence is re-created, by descrambling the received signal with a copy of the faster "chip" sequence. In accordance with one aspect of this invention, direct multi-value spreading and de-spreading is enabled. Since an important element in wireless technology, such as CDMA, is the availability of spreading sequences, this invention by enabling the creation of multi-value sequences for spreading and de-spreading, enables a much better usage of bandwidth by wireless and CDMA applications.

As described in provisional patent application No. 60/501,335, filed on Sep. 9, 2003, and in the non-provisional patent application Ser. No. 10/912,954 filed on Aug. 6, 2004, that claims the benefit of provisional patent application Ser. No. 60/501,335, this invention can be embodied in binary logic with A/D and D/A converters in such a way that it performs multi-value digital functions.

In one scrambling technique, scrambling a binary signal requires a second known binary signal. In order to descramble or recover the original signal, the second known binary signal should be available as an input to the descrambler. Application of a Linear Feedback Shift Register (LFSR) connected with the applied XOR function allows for the self-generation of this second known binary signal. A descrambler consisting of the mirror image of the LFSR based scrambler creates, in a similar fashion, the appropriate second known binary signal which can be used to descramble the signal.

It is known that LFSRs with XOR functions can create binary digital signals consisting of a sequence of binary elements that may have attractive statistical characteristics know as Pseudo Noise or Pseudo Random Noise. It can be shown that LFSR based binary sequence generators are in fact LFSR based scramblers with a connecting device to the input that makes the input not relevant.

FIG. 1 shows the canonical form of a LFSR based binary scrambler 300 and its corresponding descrambler 302. The binary n-stage LFSR scrambler 300 comprises a binary shift register 304 with n elements 305 to 309. Thus, the LFSR scrambler 300 in FIG. 1 is a 5-stage LFSR scrambler. The output of each element in the shift register (except the last element) is the input to the next element. Based on preferred characteristics, a feedback tap can be installed from an element into a binary scrambling/descrambling function or device. In binary technology, the binary scrambling/descrambling function or device 310, 311 and 312 of choice is predominantly the Exclusive OR or XOR function, also known as Modulo-2 addition. One can vary the number of stages and the number of feedback taps to determine the characteristics of the scrambler. The theory for this is widely known.

The LFSR based binary descrambler 302 to recover the original signal is the minor image of the LFSR scrambler 300. Thus, the descrambler 302 includes a shift register 314 having n elements 316 to 320 and devices 322, 323 and 324. The devices 322, 323 and 324 implement the XOR function.

LFSR based binary pseudo-random sequence generators are also prior art. FIG. 2 shows a canonical form of a binary LFSR-based sequence generator 326. In the sequence generator, the scrambling/descrambling device or function between a data input and the LFSR feedback has been removed (short-circuited), and no input signal is needed. The only requirement is that the initial content of the shift register is not all zero. As soon as a clock-signal is provided to shift content from one element to the next, the output of this device will be a sequence of binary symbols. The characteristics of the sequence are determined by the length of the shift register, the number of feedback taps and the initial content of the shift register. As is well known, the output from the sequence generator 326 can be taken from any point in the circuit. The binary sequence generator of FIG. 2 is prior art.

All LFSR based scramblers, descramblers and sequence generators require a clock signal. On every occurrence of the clock signal, the content of the elements of the shift registers is moved one position. In all figures describing systems applying an LFSR, the availability of a clock signal is assumed (though not always drawn). Furthermore in the figures of this application, all content of elements of a shift register is assumed to move from left to right one position on the occurrence of a clock signal.

A novel approach to create a sequence generator is to apply the scrambler configuration of FIG. 1, where the scrambler has an input data signal. This is shown in FIG. 4. The device or function S that connects the input and the feedback from the LFSR in FIG. 4 is different from the XOR function. FIG. 3 shows the truth table of function or device S.

The device or function S will pass on the value of one input no matter what the other input is, as indicated by the truth table in FIG. 3. A binary LFSR based scrambler or signal generator applying this function or device can be constructed, as is shown in FIG. 4. The circuit of FIG. 4 includes a five element shift register 328, XOR devices 330 and 332 and the device S. The order of the applied inputs of function or device S in FIG. 4 is important. If the order is switched, the scrambler will pass on the input signal input Sigin without change. In the appropriate configuration, the scrambler will not depend on signal Sigin, but will act as a binary LFSR based sequence generator. Thus, the input, Sigin, should be passed through the device S The binary sequence generators and binary LFSR scramblers are closely related and apply the similar structures, functions (XOR) and circuits. The scrambling performance of binary scramblers and LFSR scramblers changes with the number of applied number of XOR functions and in LFSR devices also with the length of the shift register.

Presently digital signal scramblers mainly are applied for binary signals and use components that will execute the binary XOR function. The current description, in accordance with one aspect of the present invention, limits itself (for making the explanation easier) to function devices that have two multi-value inputs (say 'a' and 'b') and one multi-value output (say 'c'). The binary XOR function is also represented by $\neq$. FIG. 5 shows a 2 input single output logic device, representing the binary $\neq$ function. The functional behavior of this component (the binary XOR) is well known and is described by its truth table shown in FIG. 6.

The Ternary Scrambler and Descrambler

FIG. 7 shows a diagram for a 2 input single output ternary logic device scr2. This device scr2 processes a ternary signal that can assume one of three different states. FIG. 8 shows the corresponding ternary logic truth table in accordance with one aspect of the present invention. As described in provisional patent application 60/501,335 and in non-provisional patent application Ser. No. 10/912,954, filed Aug. 6, 2004, which claims the benefit of provisional patent application 60/501,335, the inventor has created a method and apparatus for digital ternary signal scrambling/descrambling by applying one or more of three truth tables that have the property of being self-reversing. Self-reversing functions have the property that if applied twice in sequence to an original signal, the original signal will be recreated. Thus, a signal scrambled with a self-reversing function can be descrambled with the same function. Functions that are self reversing satisfy the three equations: A sc B=C; C sc B=A and C sc A=B.

FIG. 9 shows the truth tables of three commutative ternary logic self reversing functions: scr2, scr3 and scr5. Commutative functions are mirrored about the diagonal axis of their truth tables. Note that there are more non-commutative self-reversing ternary logic functions. The top row in the depicted ternary truth tables represents the possible values that an input 'a' to a two-input ternary device (with inputs 'a' and 'b') can assume. It is noted that '0', '1' and '2' represent a way to distinguish between three different states. The physical value of these states can be different from '0', '1' and '2'. The left column in a truth table represents the possible values that the input 'b' to a two inputs ternary device (with inputs 'a' and 'b') can assume. The three by three matrix under the horizontal line and to the right of the vertical line in a truth table represents the possible values (or 'states') that an output 'c' of a ternary device can assume, depending on the input values of 'a' and 'b'. One can use a truth table as representing all possible combinations of the equation: c→(a scr b). This equation can be interpreted as: the value of 'c' generated by a device with describing truth table 'scr' with inputs 'a' and 'b'. One can also take the values of 'a' and 'b' as the coordinates of the generated result. 'a' represents in this case the column of the 'scr' matrix and 'b' the row. Of course, the term row can mean column and the term column can mean row. The truth tables of functions or devices 'scr5', 'scr3' and 'scr2' shown in FIG. 9 are commutative and self reversing. This property of reversibility provides the invention with the unique capability for a scrambling device to be its own descrambler.

N-Value Reversing Functions

An n-value digital logic device comprised of 2-inputs and a single output and with n a positive integer greater than 2, has at least a number of n self-reversing commutative functions that can be used as scrambler/descrambler functions. The setup for the shown ternary scramblers and descramblers applies to n-value logic scramblers and descramblers executing self reversing commutative functions complying with the canonical form.

FIG. 10 shows the canonical form of a self reversing n-value truth table. The value of m=(n−1). By moving all rows in the truth table down one position and moving the bottom row to the top, additional commutative self reversing (but different) n-logic functions are obtained. This process can be repeated n−1 times before the truth table returns to its original position.

N-Value Inverters—Ternary Reversible Inverters

FIG. 11 illustrates ternary reversible inverters. A ternary reversible inverter is a function or a device that transforms each element from the set of symbols, states or values of a ternary or 3-value logic into an element of a ternary logic. The element that is being transformed is called the parent and the result of the transformation is called the child. Each child has one parent and each parent has one child.

Consequently a ternary logic signal has six possible ternary inverters. Each of these inverters is reversible. FIG. 11 shows the six ternary reversible inverters $i_1$, $i_2$, $i_3$, $i_4$, $i_5$, and $i_6$. The first inverter $i_1$ is the identity as all elements in transformation return their own value or state. Inverters $i_2$, $i_3$ and $i_6$ are self reversing inverters. Applying these inverters once, followed by again applying the inverter on the result of the first inversion returns the original elements. Of course, inverter $i_1$, called the identity inventor, is also self reversing, but, by itself, has limited usefulness in scrambling technology.

A novel way to form a self reversing ternary scrambler function is to construct a 3×3 truth table by putting a self reversing inverter as one of three columns in the truth table. An example is shown in FIG. 12. This is repeated for each column in the truth table.

The truth table of the ternary scrambling function 'scr' shown in FIG. 12 is formed by using inverter $i_3$ once and inverter $i_2$ twice. Thus, in FIG. 12, the column under "0" is created by applying inverter $i_3$. The column under "1" is created by applying inverter $i_2$, as is the column under inverter $i_3$. It is assumed that $i_1$, $i_2$, $i_3$ and $i_4$ in FIG. 12 are self reversing inverters, including the identity. As long we do not use only identity inverters and self reversing inverters are used, the constructed function will be a self reversing function and can be used as a scrambling/descrambling function. Just a limited number of the thus constructed truth tables will be commutative (or input order independent) such that the inputs can be switched without effect on the output.

Considering commutative and non-commutative scrambling functions and by excluding self reversing functions that will generate identical images of the to be scrambled input, 4×4×4−1=63 different commutative and non-commutative self reversing ternary functions can be created from reversible ternary inverters that can be applied in ternary scrambling/descrambling devices.

The inverters $i_4$ and $i_5$ in FIG. 11 are reversible inverters but are not self reversing. This means that by applying another reversible inverter after applying $i_4$ or $i_5$, one can recover the original input. The reverse of $i_4$ is $i_5$ and the reverse of $i_5$ is $i_4$. Overall, one can create 6×6×6−1=215 reversible ternary scrambler functions (the 1 is a function consisting of all identity inverters, which is not a scrambler function).

Figures 13, 14, 15:
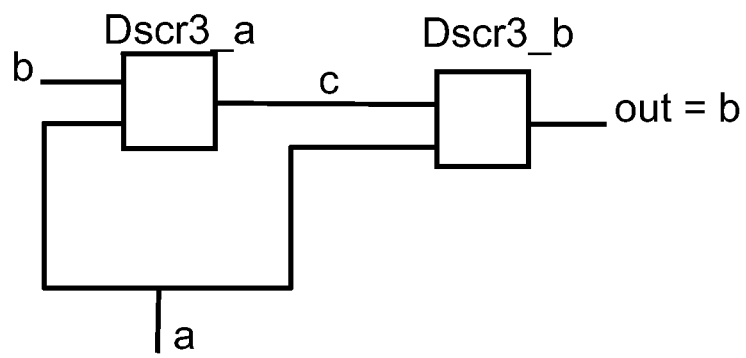
FIG. 13 shows the truth tables belonging to a pair of ternary reversible functions that are each others reverse but are not self reversing.
FIG. 14 shows a diagram of two devices that embody the two ternary functions of FIG. 13 that demonstrate the scrambling and descrambling capabilities.
FIG. 15 shows a truth table of a weak ternary scrambling function.

FIG. 13 shows, as an example, a pair of two ternary reversible functions that are each others inverse but are not self reversing.

The function scr3_a shown in FIG. 13 is formed with ternary inverters: $i_1$, $i_4$ and $i_5$ in consecutive columns of the truth table. The ternary function scr3_b which should reverse the scrambling activity of scr3_a has the ternary inverters $i_1$, $i_5$ and $i_4$ in its consecutive columns. Thus, the ternary functions scr3_a and scr3_b are not self reversing because they use the inverters $i_4$ and $i_5$ from FIG. 11 to construct the truth tables.

FIG. 14 shows the two functions of FIG. 13 embodied in the ternary devices Dscr3_a and Dscr3_b. This configuration shown in FIG. 14 demonstrates its scrambling/descrambling capabilities. Thus, a signal scrambled by a scrambler having the architecture shown in FIG. 14, but using the ternary logic functions scr3_a and scr3_b, could be descrambled by the circuit of FIG. 14. Anytime a ternary logic signal is scrambled using a ternary logic function whose truth table has a column defined by a non-self reversible inverter, such as $i_4$ and $i_5$ from FIG. 11, a one step descrambler function must use the reverse of the inverters $i_4$ and $i_5$ to define the descrambling function for those columns. As previously mentioned, the reverse of $i_4$ is $i_5$ and the reverse of $i_5$ is $i_4$.

Some of these functions will not have very strong scrambling properties. In the case of scramblers/descramblers executing non-commutative self reversing functions, care should be taken in maintaining the order of inputs. If not, the descrambler will not correctly recover the original input. As an example of a very weak scrambler, the following truth table, in FIG. 15, is shown.

The function in FIG. 15 is an example of a very weak non-commutative (only the column under the input "1" has scrambling properties) self reversing ternary function. The first column is an identity, so no scrambling takes place. The second column transforms 1 to 2 and 2 to 1, but leaves 0 a 0. The third column is again an identity. Thus, there is little scrambling activity.

Scrambler systems comprised of consecutive reversible (commutative or non-commutative) devices have matching combined descrambler systems that have the reversing functions of the scrambler system in reverse order.

Canonical commutative self-reversing functions operate under the odd/even rule. This rule specifies that a composite n-value digital scrambler comprising an odd number of n-value commutative self-reversing scrambling functions is its own descrambler. The rule that applies to the canonical commutative self-reversing functions does not apply to systems applying one or more functions not belonging to the group of canonical commutative scrambling/descrambling functions.

There are 215 reversible ternary logic function based signal scrambling devices, of which 63 are self reversing. The modulo-3 addition function for ternary scrambling does not properly scramble and descramble a ternary signal.

4-Value Inverters

The same reasoning applied to ternary logic can be applied to 4-value logic and higher value logic. 4-value logic has 4×3×2=24 inverters of which one is the identity. With these 24 inverters 24×24×24×24−1 different commutative and non-commutative reversible and self-reversing 4-value scrambling 4 by 4 truth tables can be constructed.

Figure 16:
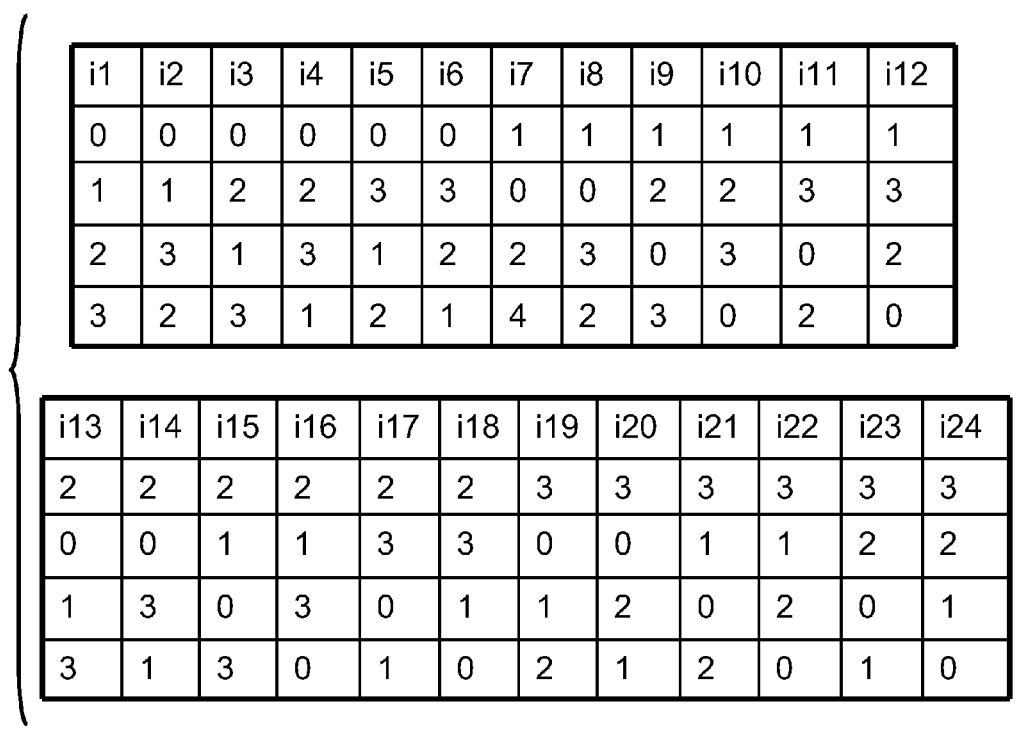
FIG. 16 shows a table of 24 reversible 4-value logic inverters including the identity function.

FIG. 16 shows a table with the 24 possible 4-value reversible inverters. A reversible inverter of a logic signal is a transformation of all possible states or values of that logic to a state that also belongs to that logic. The original state before inverting or transformation is called the parent. The result of the transformation is called the child. Each child has one parent. Each parent has one child.

There are 24×24×24×24−1 different reversible 4-value digital signal scrambling devices. The modulo-4 addition function does not properly perform the scrambling and descrambling functions for 4-value scrambling.

Figure 17:
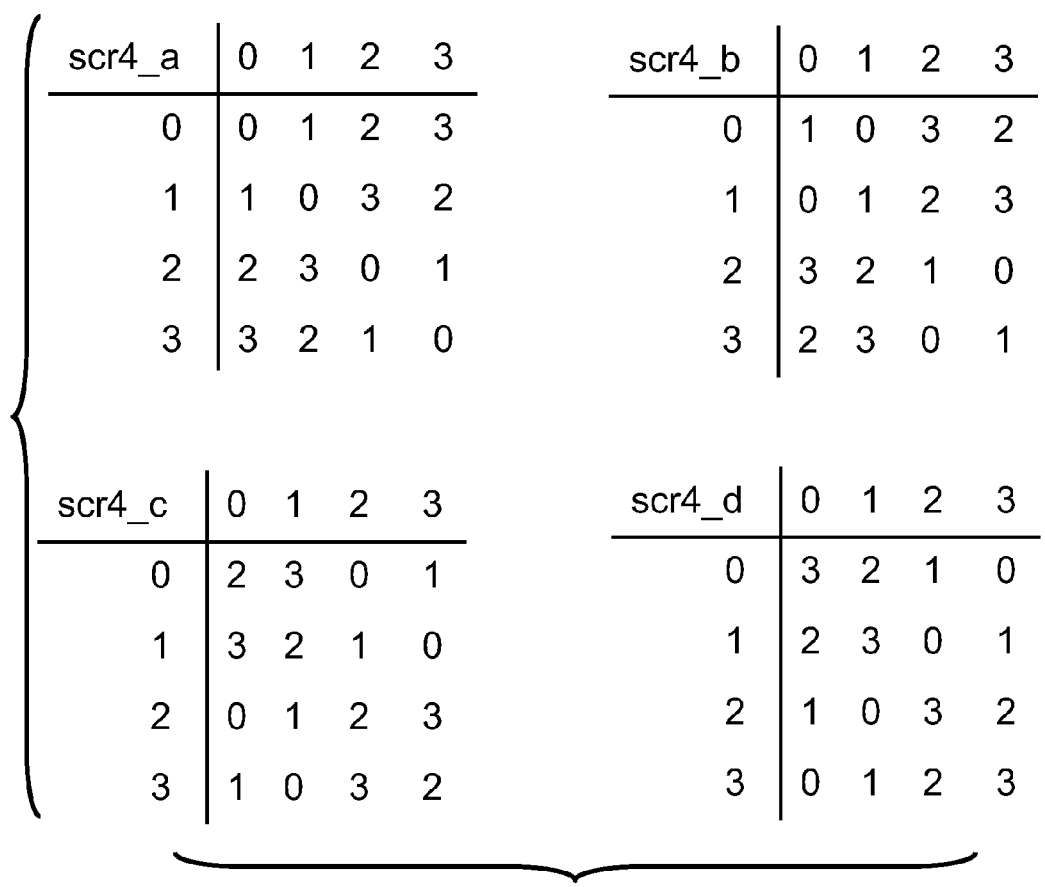
FIG. 17 shows 4 self reversing 4-value logic truth tables that are not equal to the 4-value logic canonical self reversing functions.

In the provisional application for patent 60/501,335 filed on Sep. 9, 2003 and in the non-provisional patent application having Ser. No. 10/912,954, filed Aug. 6, 2004, 4 canonical commutative self inverting 4-value scrambling/descrambling functions are described. In FIG. 17, an additional 4 commutative self-inverting 4-value scrambling/descrambling functions are provided, comprising the 4-value digital inverters: $i_1$, $i_8$, $i_{17}$ and $i_{24}$.

N-Value Inverters n-value inverters can also be created. The inverter based approach of the present invention allows creating 2× 3×4× . . . x n=n! reversible n-logic inverters (with n a positive integer). The invention here described can create (n! to the power of n) minus 1 different n-value logic scrambler/descrambler devices applying the (n! to the power n) minus one different reversible n-value logic truth tables.

It is believed that there are (n! to the power n)−1 different reversible n-value digital signal scrambling devices. The one not included is the function comprising all three identity inverters.

All the scrambler devices designed according to this invention can be used as single or combined systems as described in the ternary case. The combined n-value scrambling systems comprising an odd number of canonical commutative self reversing individual scramblers can be used as its own descrambler.

n-Value Scrambles And Descrambles as Signal Spreaders And Despreaders

The present invention allows for n-value scramblers and descramblers as signal spreaders and de-spreaders. Spreading and de-spreading of binary signals as known in the prior art of spread spectrum technology is in essence scrambling of a rapidly changing signal sequence (chip sequence) with a much slower changing data signal. De-spreading is the descrambling of the spreaded signal with a copy of the original rapidly changing signal sequence. n-value scramblers, comprising one or more of the n-value reversible logic functions, are an excellent way to create n-value spread spectrum digital signals. The application of n-value scramblers as n-value digital signal spreaders is one aspect of the present invention.

Figure 67:
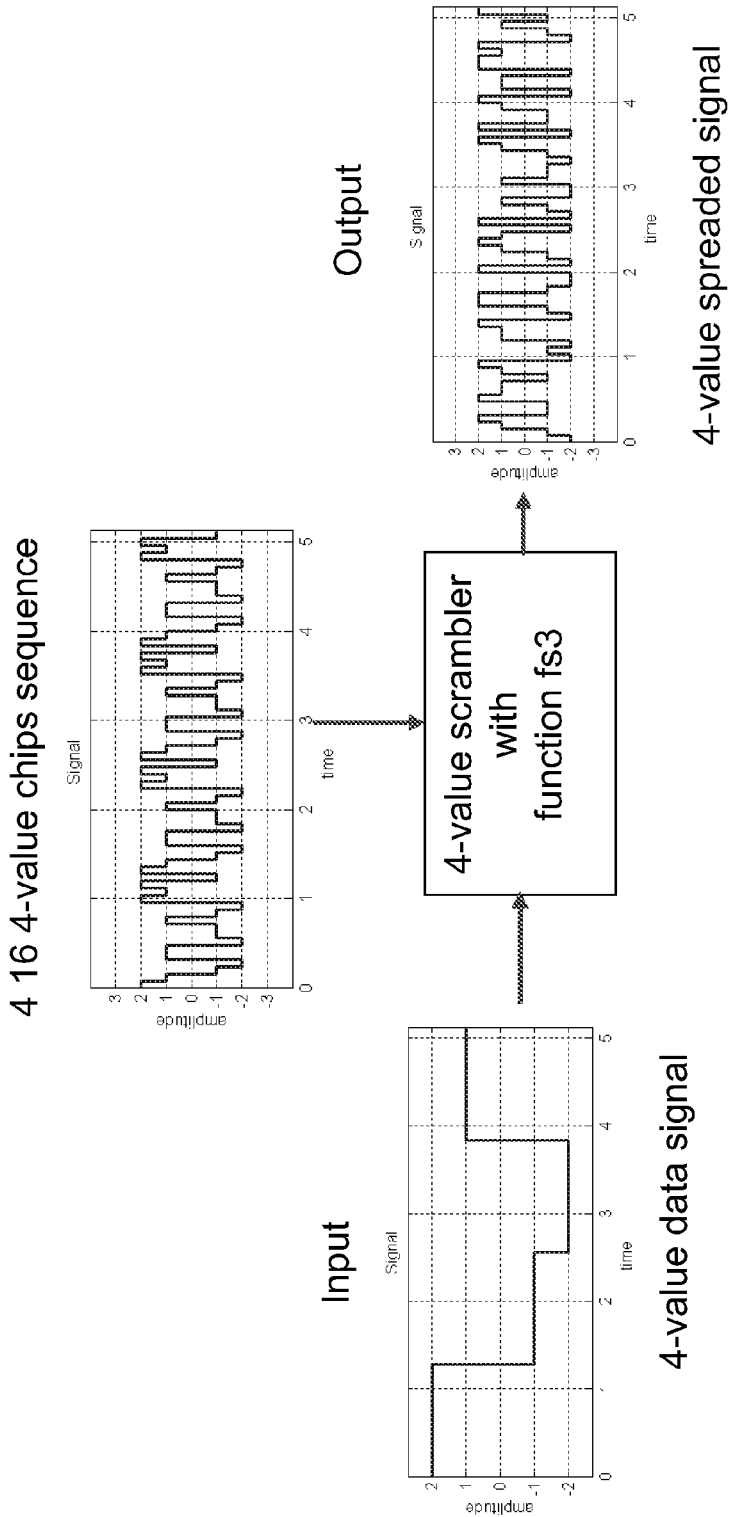
FIGS. 67 to 69 illustrate further embodiments of the present invention.
Figure 68:

As an example, FIG. 67 shows a 4-value spreading application by applying the 4-value scrambling function fs3, as shown in FIG. 68. In order to show the signals as being symmetrical, the representation of the 4-value logic states 0, 1, 2 and 3 have been adapted to −2, −1, 1 and 2, as shown in FIG. 68.

The spreading application shows how a 4 element 4-value digital signal is scrambled with a much faster 4-value signal comprising 4 16 chip digital sequence. The resulting output is the spread 4-value signal.

Figure 69:
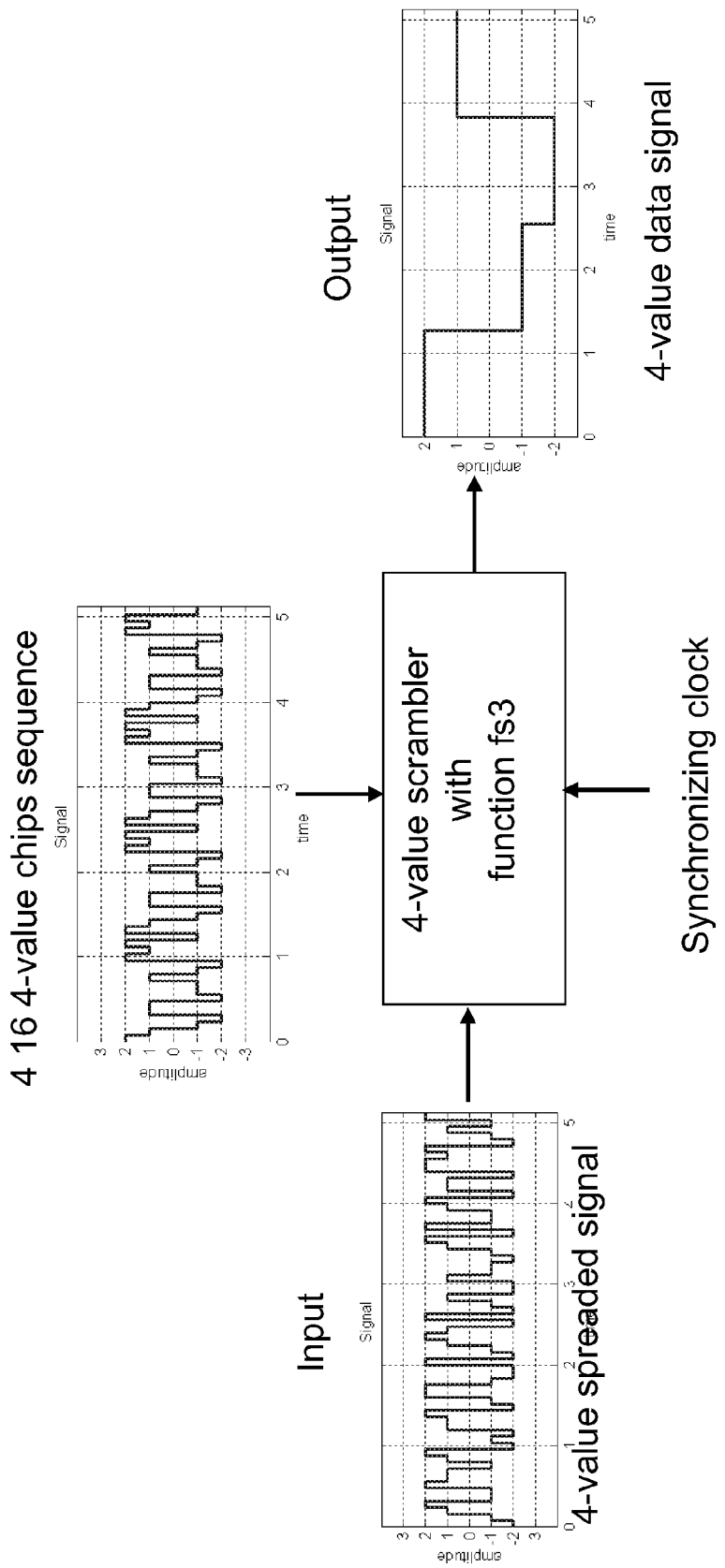

The recovery or de-spreading of the spread (or scrambled) 4-value signal takes place at the de-spreader or descrambler shown in FIG. 69. Because the 4-value function fs3 that spreads the signal is self reversing, it can be applied in the de-spreader to recover the signal. The diagram of FIG. 69 is similar to FIG. 67. The addition is a synchronizing clock signal that makes sure that the incoming spread signal and the descrambling 4-value chip sequence are in phase. If these two signals are out of phase, the resulting output of the device is not equal to the original 4-value data signal. Prior art describes several ways to create a synchronizing clock and the supporting synchronization circuit. One way is to synchronize signals with a common pilot signal or derive synchronization from the properties of the signal (such as auto- and cross correlation). In accordance with one aspect of the invention, n-value descrambling functions applied as n-value digital signal despreaders are used.

LFSR Based Multi-Value Scramblers

Figure 18:
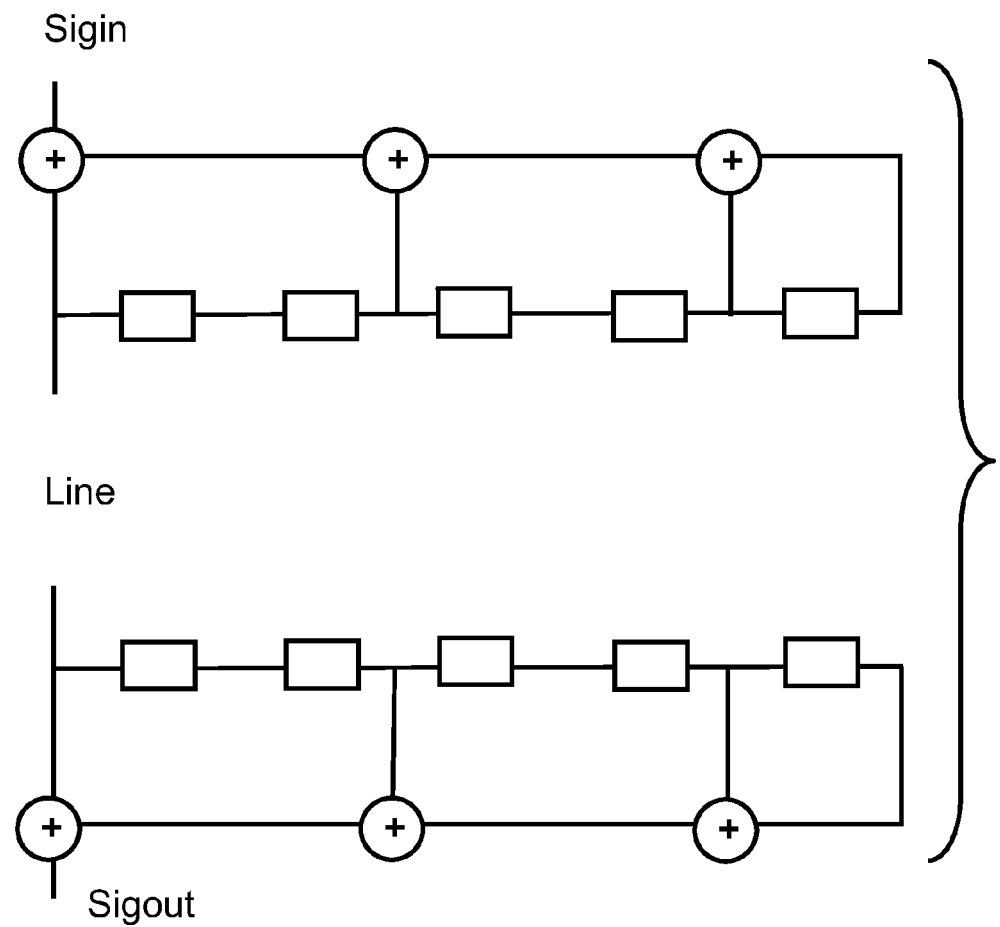
FIG. 18 shows a diagram of a prior art binary Linear Feedback Shift Register based binary scrambler and its matching descrambler.

LFSR based multi-value scramblers are contemplated by the present invention. The binary case will be considered first. FIG. 18 shows the basic configuration of a binary Linear Feedback Shift Register scrambler 350 and its matching descrambler 352. The scrambler 350 in FIG. 18 comprises a shift register having memory elements. A shift register has a series of at least 2 memory elements. Each memory element can contain (in the binary case) the representation of the value 0 or 1. Triggered by an event (like a clock-pulse) the content of each element is shifted one position to its next neighbor, in this case to the right. As long as a memory element contains a value, this value is available as an output signal of the memory element. At least one of the outputs of the memory elements is fed back to the incoming signal. There it is combined with the incoming signal through a two input/single output digital 'exclusive or' device. The output of the 'exclusive or' is usually considered to be the scrambled signal. The devices labeled "≠" are XOR devices.

The scrambled signal is then transmitted to the descrambler 352. It is also fed to a shift register and on the specified event (like a clock pulse) will become the content of the first element of the shift register. The feedback connections from the outputs of elements of the shift register are called taps. In a binary device, taps are connected with each other through an 'exclusive or' (XOR) device. If there is only one tap the feedback tap is connected with the incoming (to be scrambled) binary signal. The number of taps as well as the number of elements (or the length) of a shift register determine the statistical characteristics of the scrambled signal. The initial appearance of the scrambled signal is also determined by the initial content of the shift register elements.

The descrambler is a mirror image of the scrambler as shown in the above figure. The principles are exactly the same as in the scrambler. The binary descrambler should have a shift register of equal length as the binary scrambler and feedback taps from the elements in the same position as in the related binary scrambler. The connections between the feedback taps are also made through binary 'exclusive or' (XOR) devices. Complete recovery of the signal is possible if the initial content of the elements of the shift register of the descrambler at the start of receiving is the same as the content of the initial content of the shift register of the scrambler. However after a certain number of steps (having cleared the initial content of the shift register) the descrambled signal will be equal to the original signal no matter what the initial content of the descrambler shift register was.

All LFSR based devices described in this application are governed by a clock signal that will not be drawn or identified in all figures. Such a clock signal is well known.

The Ternary LFSR Scrambler/Descrambler Case

Figure 19:
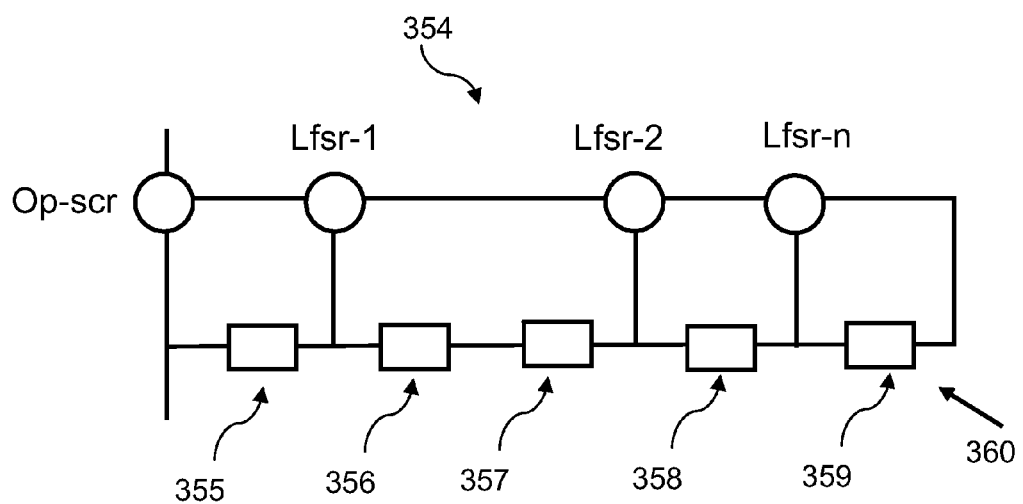
FIG. 19 shows a multi-value LFSR based scrambler.

The canonical lay-out of ternary LFSR scramblers (or n-value LFSR scramblers) can be the same as the binary form. However, as recognized by the present invention, the applied scrambling functions are different. FIG. 19 illustrates one possible (multi-tap) lay-out of a multi-value LFSR based scrambler 354 based on one aspect of the present invention.

In the ternary case, all memory elements 355 to 359 of the shift register 360 are able to contain '0', '1' or '2' value or state representations. An n-stage LFSR ternary scrambler can have a maximum of n feedback taps and a maximum of (n−1) devices to connect the taps and one final device (named Op-scr) to connect the incoming ternary signal with the feedback (or the result of the feedbacks). The devices that connect the output of a shift register element with a previous result (or in the case of the last tap with another element output) are named 'Lfsr' functions with a number added to indicate different functions.

The device that combines the incoming digital data signal with the feedback from the LFSR and has as output the input to the first stage of the shift register is called Op-scr.

Figure 20:
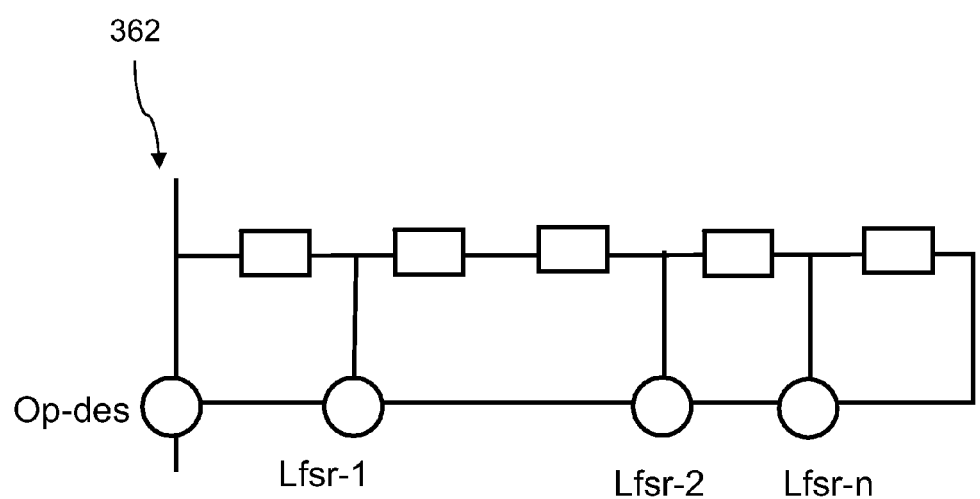
FIG. 20 shows a multi-value LFSR based descrambler.

The multi-value LFSR based descrambler 362, illustrated in FIG. 20, has a lay-out (but not always the functions) that is the minor image of the scrambler 354. This is shown in FIG. 20 which illustrates a descrambler that can descramble a signal created by the scrambler of FIG. 19.

We will maintain a similar naming convention in the multi-value LFSR based descrambler in FIG. 20. The device that combines the incoming (scrambled) signal with the feedback from the LFSR and has as output the recovered original data signal is called Op-des. All other functions are called 'Lfsr' with a number added to indicate different functions.

For an LFSR system to form a ternary LFSR based scrambling/descrambling system it has to comply with the following requirements and design rules:

First, the shift register in scrambler and descrambler are of equal length. The elements or stages of a shift register are memory elements. In a n-value logic they can contain values that range from 0 to n−1.

Second, scrambler and descrambler have identical tap configurations.

Third, the functions Op-scr and Op-des have to be a reversing pair (one is a scrambling and the other one is a descrambling function. The placement in the scrambler or the descrambler does not matter. But if one is in the scrambler the other has to be in the descrambler). The functions Op-scr and Op-des can also be equal if self-reversing.

Fourth, the functions Lfsr can be any of the reversible ternary functions formed from the ternary reversible inverters.

Fifth, a selected Lfsr function at a certain tap in the scrambler should correspond with the same function at the corresponding tap in the descrambler. In case of non-commutative functions, the order of inputs to the devices in scrambler and descrambler configurations should be the same.

Sixth, the initial content of the scrambler and descrambler shift register should be identical.

One form for an LFSR based scrambler/descrambler set would be a scrambler that only applies one commutative self-reversing function for Lfsr and Op functions. In that case, the ternary scrambler and descrambler would contain the same elements. The modulo-n addition function does not meet the criterion of being self-reversing for n being an integer greater than 2.

Another ternary LFSR scrambler/descrambler set can apply a mix of commutative ternary self-reversing functions for Lfsr and Op-functions. Another ternary LFSR scrambler/descrambler set can apply a mix of commutative and non-commutative functions for Lfsr and Op-functions. The statistical performance of the ternary LFSR scrambler is determined by the length of the shift register and the number of taps as well as where the taps are placed and what functions are used.

Proper scrambling/descrambling performance is determined by complying with the above stated design rules.

The N-Value LFSR Scrambler/Descrambler

The design rules can be expanded to the more general n-value case for LFSR scrambler/descrambler systems.

First, both n-value LFSR scramblers and descramblers should have shift registers of equal length. Each element is able to preserve as its content the representation of the values 0, 1, 2 . . . , n−1.

Second, scramblers and descramblers should have identical number of feedback taps at corresponding elements of the shift register.

Third, connecting devices should all be reversible n-value functions constructed from n-value reversible inverters.

Fourth, the functions Op-scr and Op-des have to be a reversing pair (one is a scrambling and the other one is a descrambling function. The placing in either scrambler or descrambler does not matter. But if one is in the scrambler the other has to be in the descrambler) Or the functions Op-scr and Op-des are equal if self-reversing.

Fifth, the functions Lfsr can be any of the reversible multi-value functions formed from the multi-value reversible inverters.

Sixth, a selected Lfsr function at a certain tap in the scrambler should correspond with the same function at the corresponding tap in the descrambler. In case of non-commutative functions the order of inputs to the devices in scrambler and descrambler should be the same.

Seventh the initial contents of the shift register in scrambler and descrambler should be identical for complete recovery of the original signal.

Figure 21:
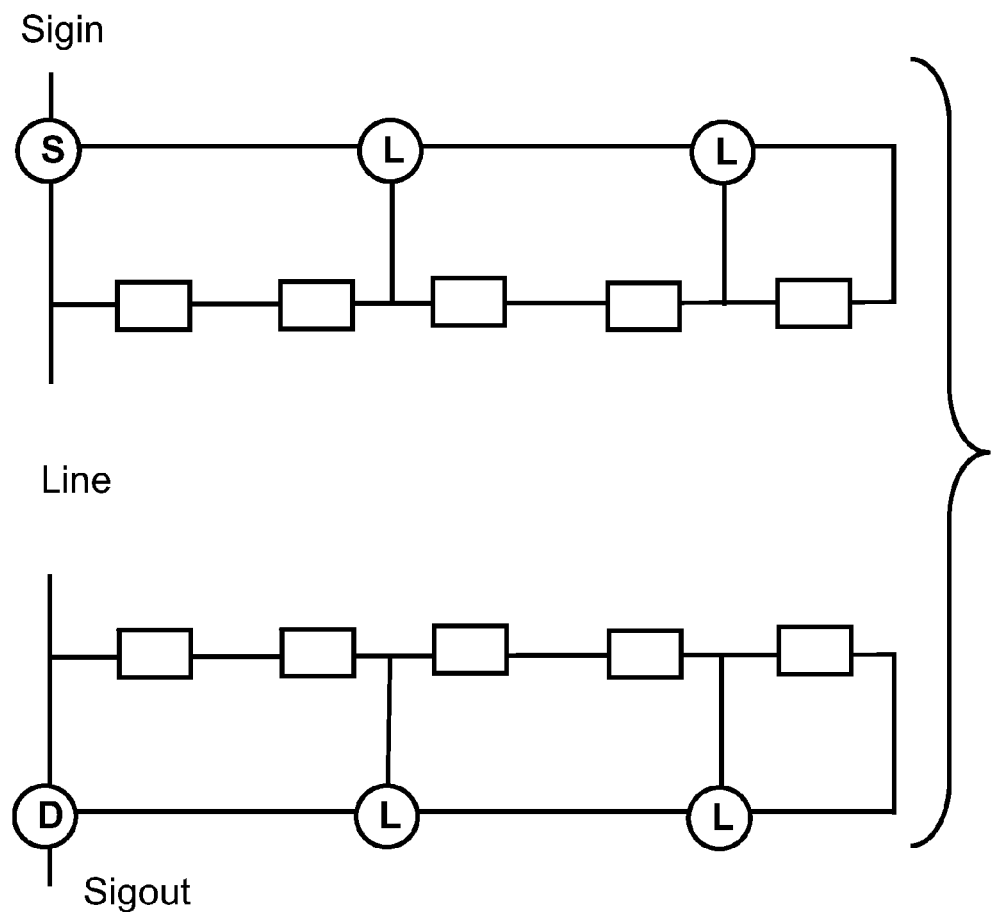
FIG. 21 shows a 4-value 5-stage LFSR based scrambler comprising only one type of self-reversing commutative function and its matching descrambler.

FIG. 21 illustrates one example of an n-value LFSR based scrambling system in accordance with one aspect of the present invention. FIG. 21 shows a diagram of a 4-value 5-stage LFSR based scrambler and its matching descrambler applying only devices with the self reversing functional truth table scr4_d, as shown in FIG. 17.

Figure 22:
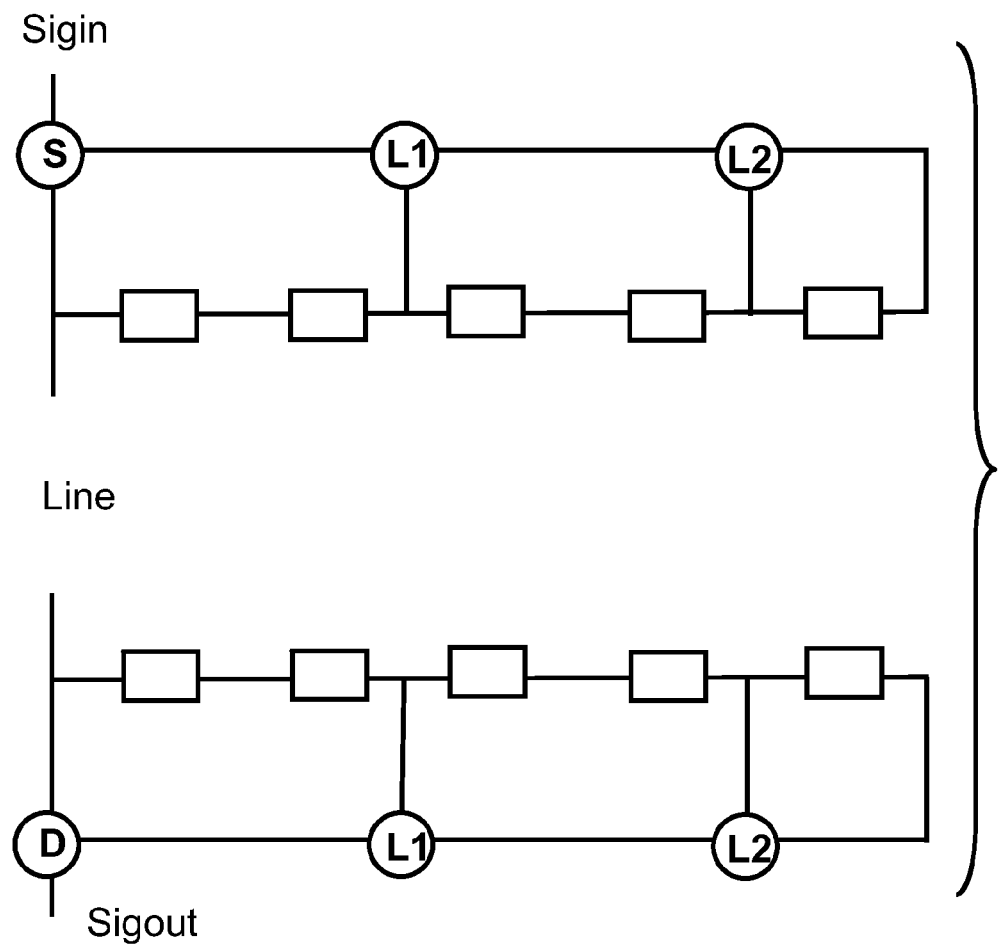
FIG. 22 shows a 4-value 5-stage LFSR based scrambler comprising 3 different types of self-reversing commutative function and its matching descrambler.

FIG. 21 illustrates another example of an n-value LFSR based scrambling system in accordance with another aspect of the present invention. FIG. 22 shows a diagram of a 4-value 5-stage LFSR based scrambler and its matching descrambler applying devices with the self reversing functional truth tables scr4_a, scr4_c and scr4_d as shown in FIG. 17. Specifically, functions S and D implement scr4_d, function L1 implements scr4_a and function L2 implements scr4_c, as shown in the figure.

Figures 23, 24:
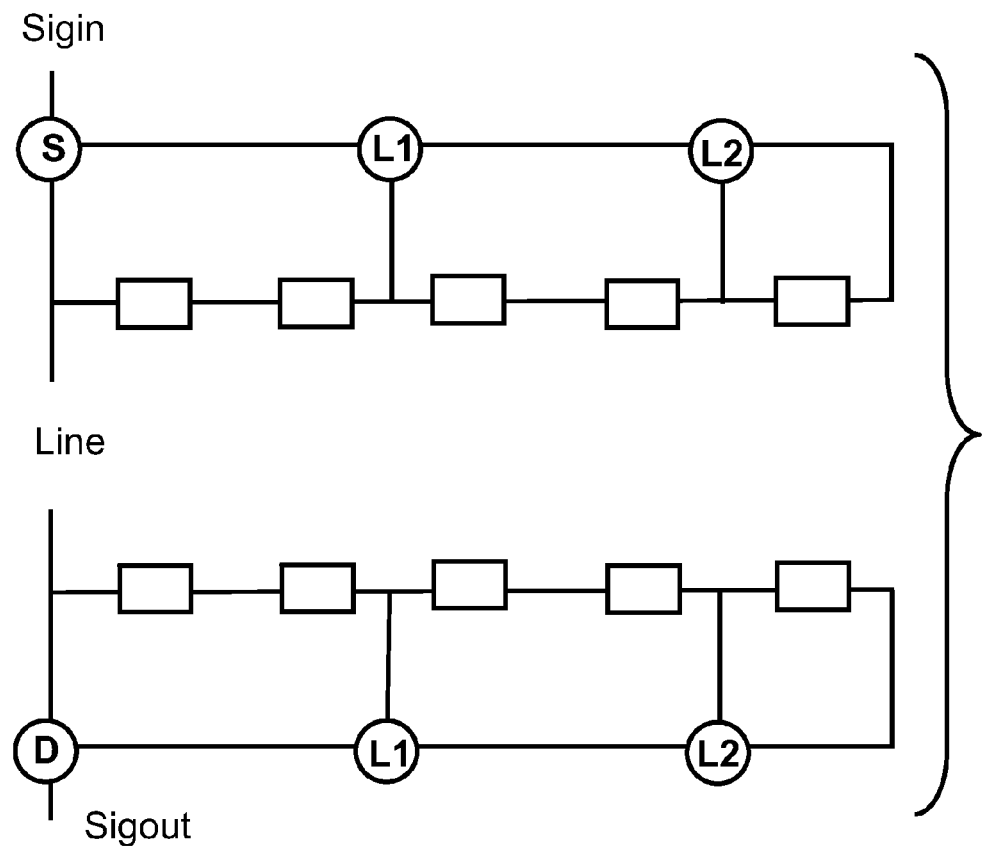
FIG. 23 shows a 4-value 5-stage LFSR based scrambler comprising 2 different types of self-reversing commutative function and one type of non-commutative self-reversing function and its matching descrambler.
FIG. 24 shows the truth table of a 4-value self-reversing but non-commutative function.

Not all self reversing multi-value functions are commutative. Another example of an n-value LFSR based scrambling system is shown in FIG. 23. Here, one of the functions applied as the connecting device between incoming input and feedback from the shift register is a non-commutative self-reversing 4-value function, scr4_g. Because function scr4_g is self reversing it is also applied in the position corresponding with Op-des in the descrambler. The truth table of the 4-value self-reversing function scr4_g is shown in FIG. 24. Note that the order of the inputs to the table of scr4_g is important to determine the output (the inputs cannot be switched) so that the function is non-commutative.

Figures 25, 26:
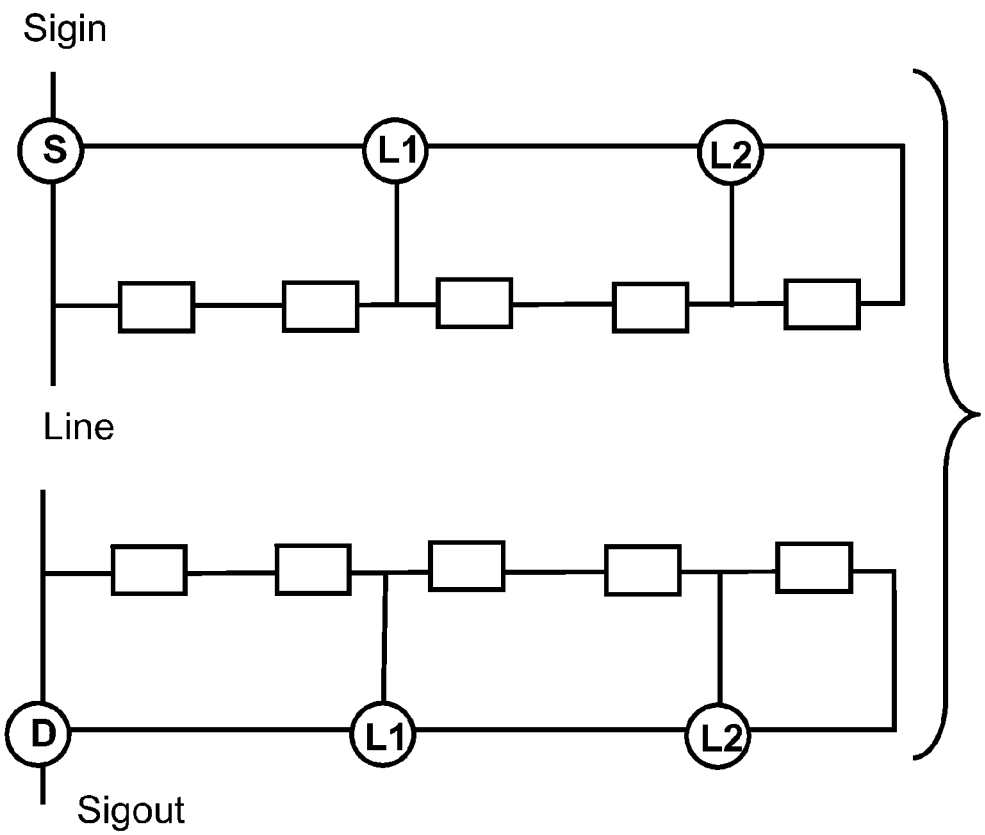
FIG. 25 shows a reversible commutative 4-value function and its reverse, a non-commutative reversible function.
FIG. 26 shows a 4-value 5-stage LFSR based scrambler comprising 4 different types of reversible functions and its matching descrambler, the different functions having two types of 4-value self reversing functions, one commutative reversible function and its reverse, a 4-value non-commutative reversible function.

Not every commutative reversible n-value function is self reversing. FIG. 26 shows the application of the reversible and commutative 4-value function scr4_e in a 4-value 5-stage LFSR based scrambler. This function is applied in the position of Op-scr. Consequently the matching function Op-des in the descrambler should be the reverse of Op-scr. This reverse is the non-commutative, reversible function scr4_f. The truth tables of scr4_e and scr4_f are shown in FIG. 25.

Prior art mentions multi-value LFSR based scrambling and descrambling but often in a cursory way, indicating a belief that multi-level LFSR based scrambling and descrambling is an extension of the binary form and displaying a limited understanding of the rules for n-value LFSR based scrambling and descrambling. As illustrated herein, multi-level LFSR based scrambling and descrambling is not a simple extension of the binary rules.

One reference the inventor found to a related approach was in the Help Pages of Mathworks Simulink Communication Blockset on Feb. 12, 2004, found on the internet. These pages describe an algorithm for n-value integer signals for LFSR based scramblers and descramblers. The help file on the web site described a set of LFSR based scramblers/descramblers that strictly apply modulo-n adders. This is appropriate for binary application. However if all applied functions (in the scrambler as well as the descrambler) as described by Mathworks are modulo-n addition the descrambler can in the described form not recover the original signal. This approach does not work to make ternary and multi-value LFSR scramblers/descramblers, and fails to recognize that modulo-n addition (with n greater than 2) is not a self reversing function.

Another example in prior art mentions modulo-n subtraction as the descrambling function for scrambling by modulo-n addition. Such an observation is not specific enough. Modulo-n addition can be implemented with an n-value commutative function. However subtraction is non-commutative. That means that if the order of inputs to an n-value subtraction is switched at the descrambler, the recovered signal in case of n-value (n greater than 2) is not the original signal. Conversely modulo-n subtraction is a set of two n-value logic functions.

Another observation is that modulo-n subtraction is a self reversing but non-commutative function in n-value logic. This has an interesting consequence for n-value scramblers (be it with or without LFSR). If an n-value scrambler, such as in FIG. 19, has n-value subtraction as n-value function Op-scr, it can have the same n-value subtraction function as Op-des in the descrambling function as shown in FIG. 20, because the subtraction function is self reversing. However the descrambler as shown in FIG. 20 can also have the function modulo-n addition as Op-des function.

Consequently the rules as described in this application provide rules that state a set of conditions that will ensure that scramblers and descramblers that comply with the rules will demonstrate complete recovery of scrambled multi-value signals. The set of rules may not be exclusive. There are other combinations of n-value functions possible that also show scrambling/descrambling capabilities.

The inventor believes he is the first to have invented methods for creating LSFR ternary and multi-value scramblers and descramblers. He also believes he is the first to be able to articulate and design different matching sets of multi-value LFSR based scramblers and descramblers.

It should be clear that because many reversible possible functions can be applied there is a large range of possible n-value logic LFSR scrambler/descrambler combinations.

n-Value LFSR Based Scramblers/Descramblers as n-Value Signal Spreaders/Despreaders The n-value LFSR based scramblers and descramblers can be used as single channel or single user n-value spreader and despreader. The present invention contemplates at least two different spreader/despreader realizations. These include an N-value LFSR based spreader/despreader with no synchronization and an N-value LFSR based spreader/despreader with synchronization.

N-value LFSR Based Spreader/Despreader with No Synchronization

In this configuration an n-value LFSR based scrambler is applied to scramble an incoming n-value data signal. The scrambler operates on a clock signal. The clock signal is significantly faster than the maximum rate of change of the n-value data signal. Each element of the n-value digital data input signal to the scrambler is assumed to have a constant duration. The number of clock pulses during the presence at the input of the scrambler of one n-value data signal element is $N_s$. One n-value digital input data signal element will thus be scrambled with $N_s$ chips. The result is a scrambled signal with $N_s$ elements. $N_s$ is called the spreading factor.

The configuration of this set-up uses the LFSR based n-value scrambler to generate the spreading chip-sequence as well as to create the scrambled sequence.

The despreading part of the invention is the matching n-value LFSR based descrambler to the previous scrambler operated at the same clock frequency. Because the descrambler is self-synchronizing there is no requirement for determination of the starting position of the received scrambled sequence. The descrambler may become temporarily desynchronized. As soon as the shift register is 'flushed' the descrambler is synchronized again.

It may be required to synchronize the clock signal of the receiving descrambler with the incoming scrambled signal in order to ensure optimal signal level detection.

Figures 55, 56:
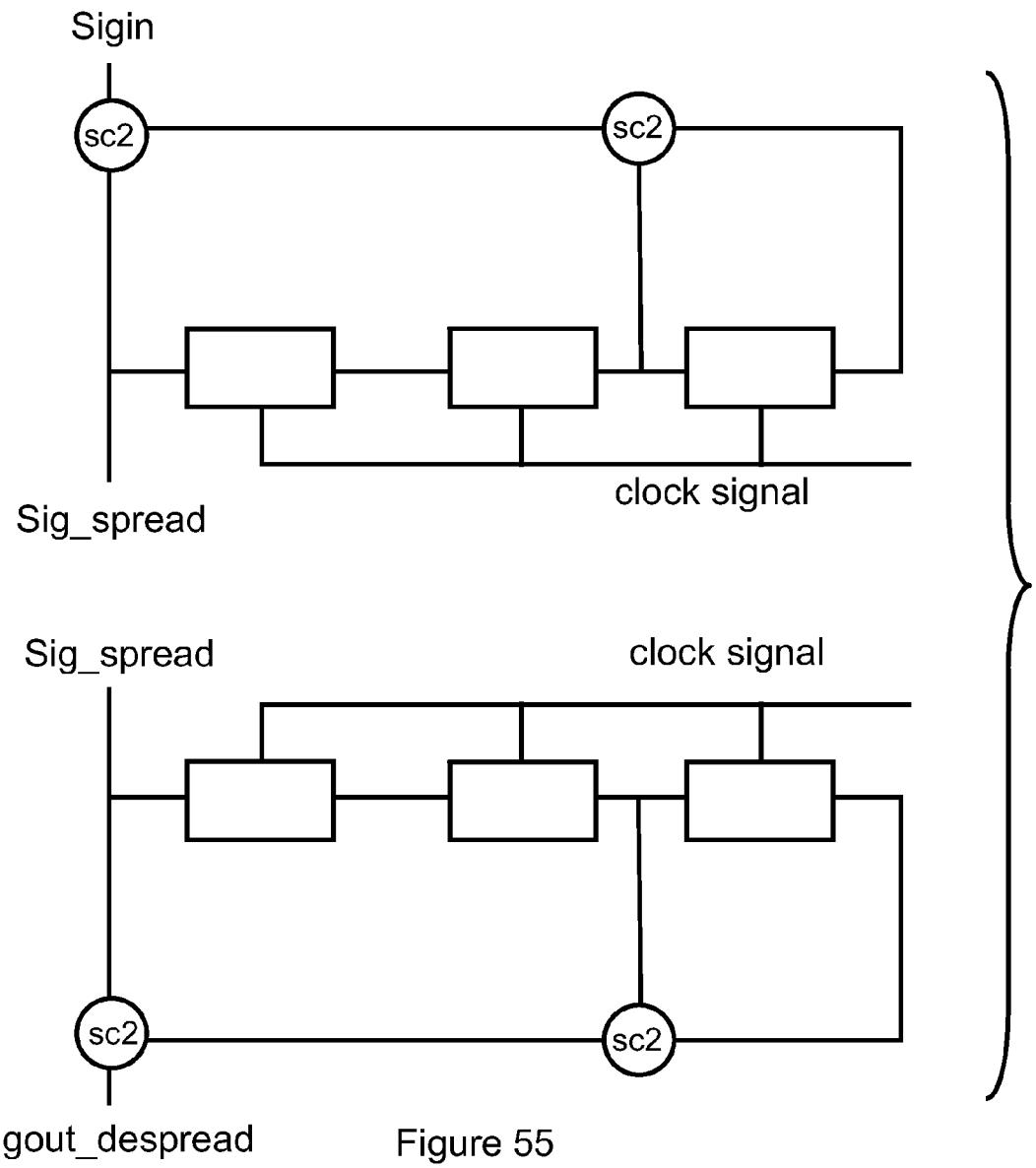
FIG. 55 shows a diagram of a ternary LFSR based signal spreader with its matching self-synchronizing LFSR based despreader wherein the applied scrambling function is the ternary function 'sc2'.
FIG. 56 shows the truth table of ternary logic function 'sc2'.
Figures 57, 58:
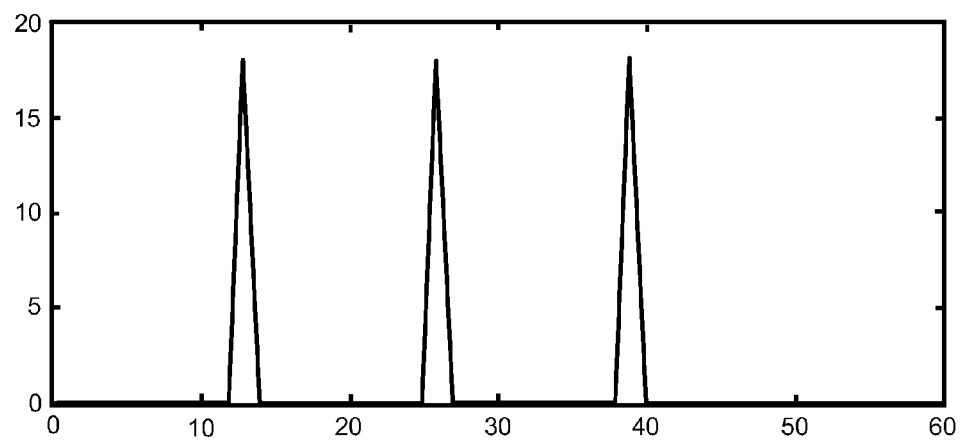
FIG. 57 shows a table of incoming ternary data signals and the resulting spread signals as generated by the system as shown in FIG. 56.
FIG. 58 shows the autocorrelation graph for the spread signal created by spreading ternary input signal 0 with the spreading system as shown in FIG. 56.

A diagram of the N-value LFSR based spreader/despreader in accordance with one aspect of the present invention is shown in FIG. 55. FIG. 56 shows the truth table of applied self reversing ternary function 'sc2'. The representation of ternary data input signal and the resulting spreaded signals by the invention are shown in FIG. 57. The spreading factor (26 in the example) is determined by the frequency of the clock-signal. The statistical characteristics of the spreaded signal are determined by the configuration of the LFSR based scrambler.

Figure 59:
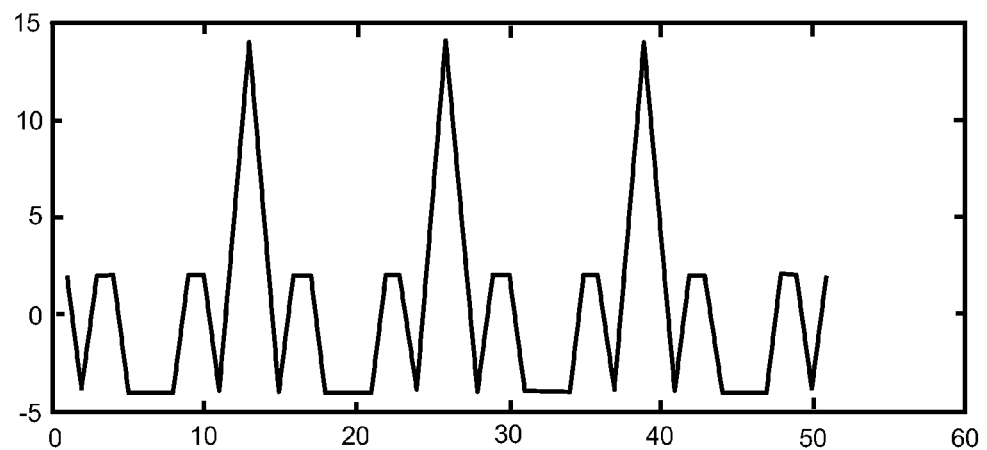
FIG. 59 shows the autocorrelation graph for the spread signal created by spreading ternary input signal 1 with the spreading system as shown in FIG. 56.
Figure 60:
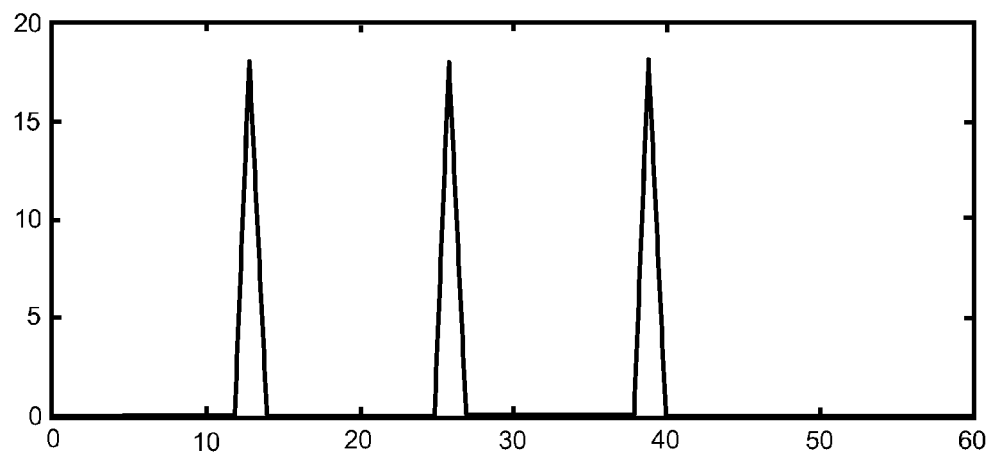
FIG. 60 shows the adjusted autocorrelation graph for the spread signal created by spreading ternary input signal 1 with the spreading system as shown in FIG. 56.
Figure 61:
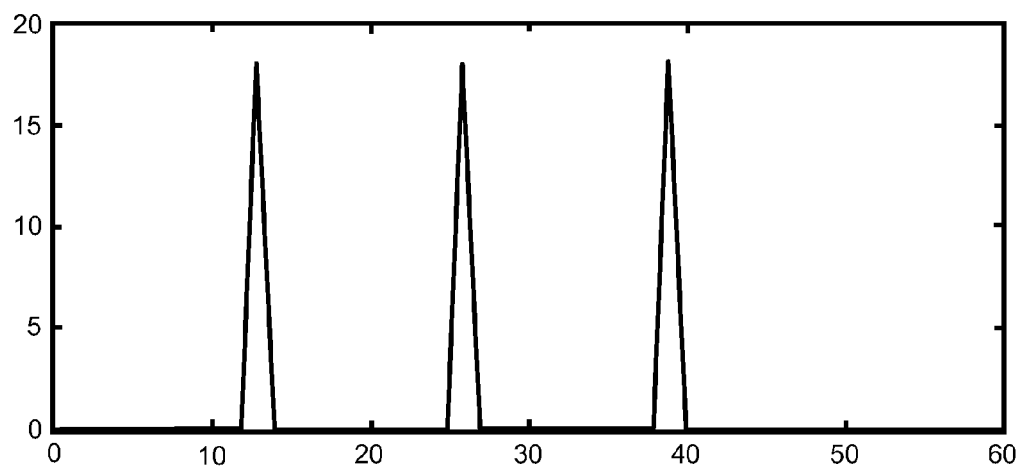
FIG. 61 shows the adjusted autocorrelation graph for the spread signal created by spreading ternary input signal 2 with the spreading system as shown in FIG. 56.

The configuration of the scrambler as shown in FIG. 55 generates a ternary m-sequence for input data signal '0'. The auto-correlation for the spreaded signal is shown in FIG. 58. The auto-correlation of the spreaded ternary signal '1' is shown in FIG. 59. The auto-correlation adjusted by applying one of the reversible ternary inverters on the received signal is shown in FIG. 60. The adjusted auto-correlation with a different ternary inverter for spreaded digital data signal '2' is shown in FIG. 61. The autocorrelation has 3 equal peaks within period $2 N_s - 1$ and is not well suited for signal synchronization. By application of the self-synchronizing descrambler no further synchronization should be required.

N-Value LFSR Based Spreader/Despreader with Synchronization

Figure 62:
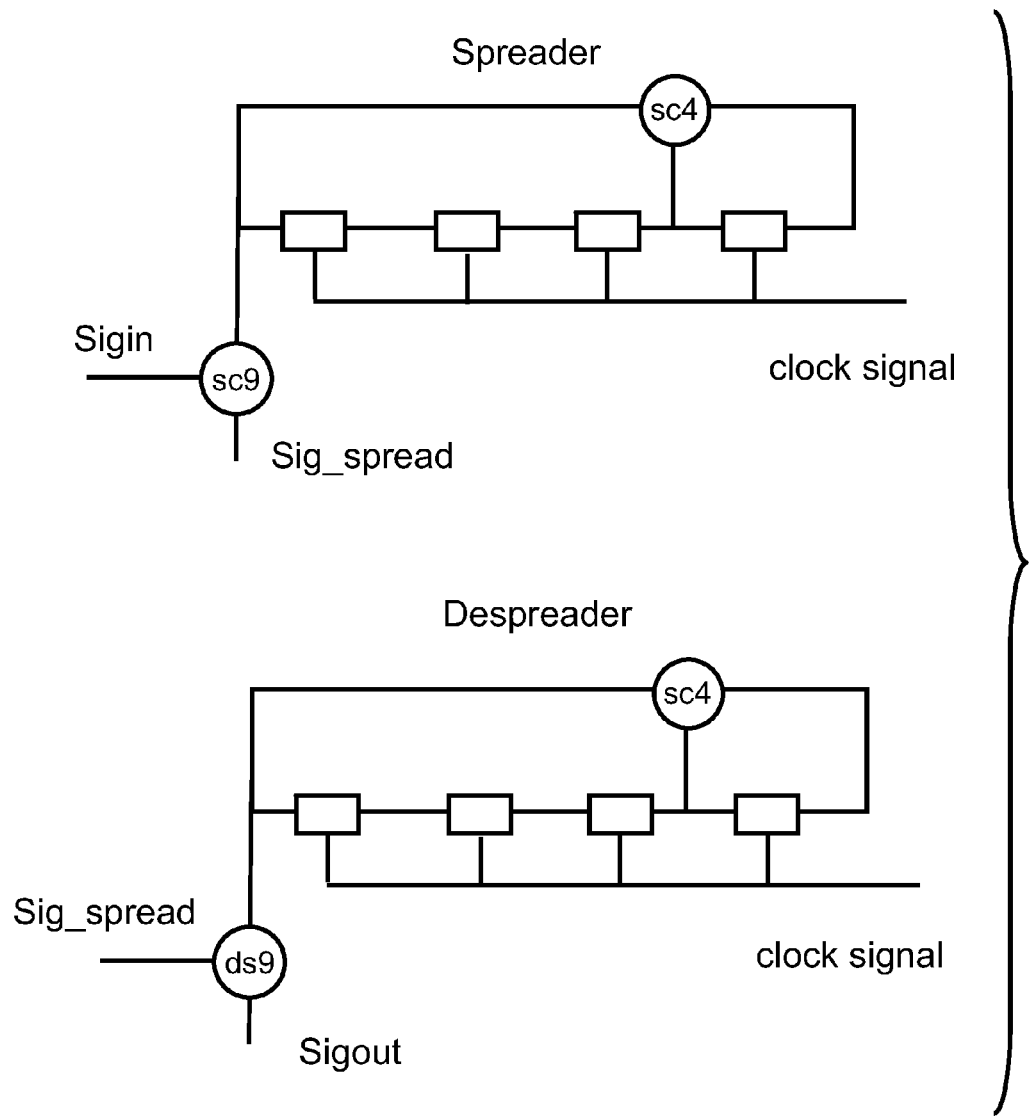
FIG. 62 shows a diagram of a ternary spreading/dispreading system applying an independent sequence generator.

FIG. 62 shows a spreader/despreader system that applies the same n-value spreading sequence generated by an n-value LFSR based sequence generator. In the figure as an example a 4-stage ternary LFSR, using ternary function 'sc4' is applied. FIG. 63 shows the truth table for ternary function 'sc4'.

The LFSR in FIG. 62 works independent of the incoming ternary data signal 'Sigin'. The output of the LFSR based sequence generator (the spreading sequence) is scrambled with the incoming ternary data-signal 'Sigin' by a ternary scrambling/descrambling device with truth table 'sc9'. The truth table of 'sc9' is shown in FIG. 64. Because the rate of change in the spreading sequence is greater than the input data signal, the data signal will be spread.

The despreader applies almost the same configuration as the spreader. The only difference is the descrambling function, which is 'ds9' or the inverse (or reverse) of 'sc9'. The truth table of 'ds9' is shown in FIG. 65.

The sequence generator of the despreader again works independently of the incoming signal. The incoming signal to the despreader function 'ds9' is the spread signal. If the spread signal and the spreading sequence are descrambled while in the right synchronization, the result of the descrambling will be the original data input signal.

The advantage of this arrangement is that just one spreading sequence is required. Each of the three different ternary input signals will create a different spreaded sequence.

There are several basic ways to synchronize the spreading sequence at the despreader with the incoming spreaded signal. The best known way of synchronization is to apply a spreading sequence that has a single sharply defined correlation value.

Figure 66:
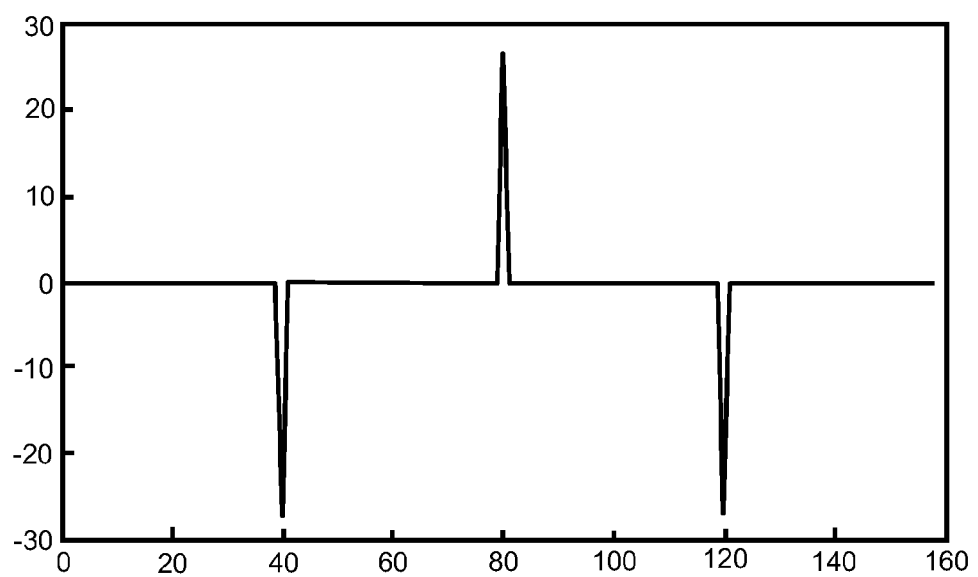
FIG. 66 shows the cross correlation graph for the possible ternary spread signals generated by the spreader as shown in the diagram of FIG. 62 and the ternary spreading sequence generated by the ternary LFSR based sequence generator wherein the ternary inverter i6 as shown in FIG. 11 is applied to the incoming spreaded signal before determining the cross correlation.

In this example there are three different sequences, originating from the same spreading sequence. In many cases, there are sequences, such as in this example, where each ternary input signal spread by the spreading sequence creates a spread signal that has identical ideal cross-correlation with the spreading signal. This is shown in FIG. 66. By applying ternary reversible inverter $i_6$ as shown in FIG. 11 to the incoming spread signal, the cross-correlation for all three possible spread signals will be as shown in FIG. 66. This is an advantageous correlation graph, as it has just one large peak at the same location. This allows for easy detection of synchronization of the incoming signal with the LFSR based sequence generator, without having to distinguish for original input data signal.

Inverter Use for Adjusting Cross Correlation

Each individual reversible n-value inverter can be used as a "simple" scrambler, inverting selectively elements from an incoming digital n-value signal. Though this does not significantly change the statistical make-up of an n-value digital signal, it can change the appearance. It can also be fully reversed. It is possible to put several inverters consecutively behind each other such that the input of the next one is the output of the previous one.

Another application for using the inverters in an n-value digital signal consisting of 2 or more elements is in comparing two n-value digital sequences by calculating their cross correlation. In some cases the calculated cross correlation between two digital n-value signals consisting of a sequence of more than 1 element will be a value not equal to zero. In applications it may be advantageous to be able to change signals such that their cross-correlation is zero while being able to recover the original sequence. A simple way to achieve this is to apply one or more reversible inverters to one or both of the signals, calculate the cross correlation and recover the original signals by applying the inverters in reverse order.

Another application of reversible n-value inverters is that it changes the appearance of the cross-correlation or auto-correlation in such a way that one clear peak exists that is significantly different from other values. The existence of such a distinguishing peak allows for synchronization of the signal.

Generating n-Value Digital Sequence Signals

There are many applications in digital telecommunications where the availability of binary or multi-value digital signals consisting of a sequence of binary or multi-value digital signals is desirable or beneficial. For instance the availability of certain binary sequences with particular auto-correlation and/or cross-correlation properties is critical to the appropriate functioning of spread-spectrum communication applications. More specifically multi-user systems require specific cross-correlation properties in wireless applications.

One expectation is often that the sequence signal has the appearance of being statistically random. Linear feedback shift registers are used to create this type of sequences which are known as Pseudo-noise (PN) or pseudo-random noise. These sequences may have the appearance of being random, however, they are fully deterministic in how they are created and what their characteristics are.

The terms digital multi-value sequence and signal can be interchanged in this application.

The theory of creating pseudo-random sequences is well established and there are well defined rules how to create sequences (binary as well as multi-value). As far as the disclosed prior art is concerned: n value sequences appear to be strictly generated by LFSRs with feedback taps comprising modulo-n adders and modulo-n multipliers.

One aspect of the present invention is focused on generating n-value (such as ternary) sequence signals by applying the previously defined 'reversible' n-value functions, constructed from the set of n-value reversible inverters without use of multipliers. As such, this is a new invention that has not been disclosed in prior art. It allows for replacing the theoretically combination of adders and multipliers with single multi-value digital function devices. It also can generate additional sequences with attractive properties such as cross-correlation and auto-correlation that cannot be generated by application of modulo-n addition and modulo-n multiplication.

In prior art pseudo-random number (PN) generators (be it binary or multi-value (n-value)) are Linear Feedback Shift Registers with feedback taps connected to Modulo-n adders. Further more for optimal statistical performance, some taps will contain modulo-n multipliers in the n-value case (n a positive integer greater than 2) to comply with the coefficients of calculated irreducible polynomials over the Galois Field $GF(n^P)$.

In accordance with one aspect of the present invention, n-value sequences are generated by new inverter-based, reversible n-value functions (with exception of the modulo-n adder). This aspect of the present invention offers a new and more efficient way to generate n-value sequences.

PN generators are in fact scramblers with any input from the outside combined with the feedback from the LFSR through a function that is constructed from strictly identity inverters. This is demonstrated in its binary form in FIG. 27.

Figures 27, 28:
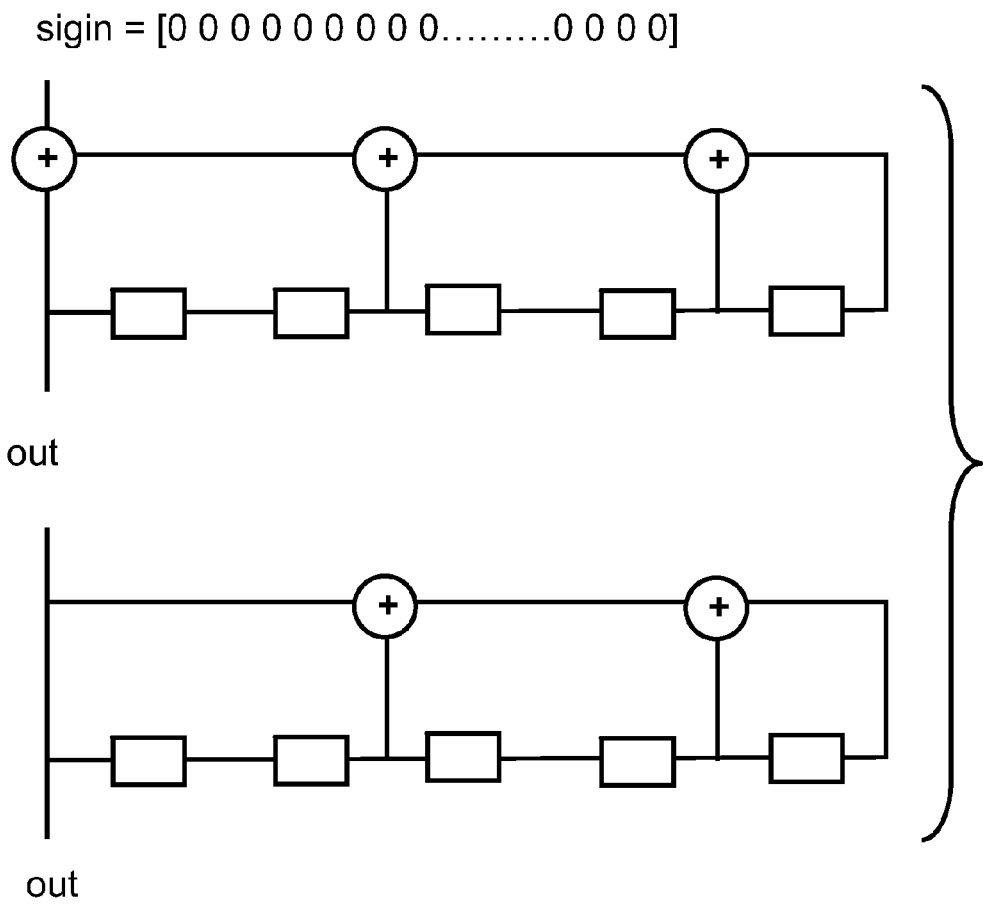
FIG. 27 shows a binary LFSR based scrambler with constant input and an equivalent circuit.
FIG. 28 shows two binary revertible inverters.

The first diagram in FIG. 27 shows a binary 5-stage, 2-tap scrambler with inputs all '0'. This scrambler can be replaced with a configuration as shown in the second diagram of FIG. 27. The device labeled as "+" is an XOR device.

There exist two reversible binary inverters as shown in FIG. 28. The first inverter in FIG. 28, $i_1$, is the identity, the second inverter $i_2$ is what is generally recognized as an inverter in that '0' is transformed to '1' and '1' is transformed to '0'.

Figures 29, 30:
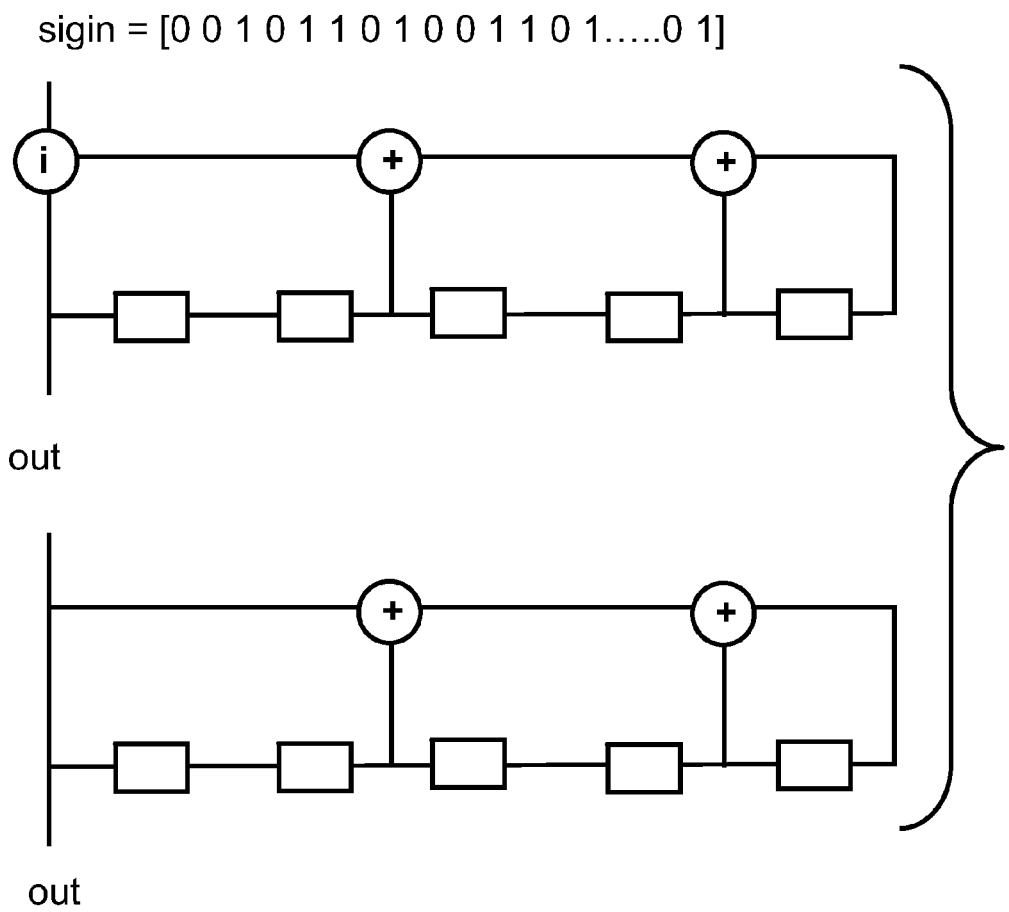
FIG. 29 shows a binary LFSR based scrambler with a non-constant input into a connecting identity function and an equivalent circuit.
FIG. 30 shows the truth table of the binary identity.

By replacing the XOR device, +, that connects the incoming signal with the feedback from the LFSR with the identity device, $i_1$, a binary scrambler can be turned into a PN generator. The input signal does not influence the outgoing signal 'out'. This new circuit is illustrated in FIG. 29. FIG. 30 shows the truth table for the binary identity.

Generalized n-Value Sequence Generators

All multi-value or n-value digital LFSR pseudo-noise generators can be treated as n-value LFSR scramblers with the operational connecting device between the incoming signal and the feedback signal being the non-commutative n-value identity function.

It is the object of this invention to create devices and methods that can generate n-value (with n an integer greater than 2) sequences, applying n-value scrambling functions, n-value inverters and n-value shift registers, without regard for the statistical properties of the sequences. Prior art describes ways to determine LFSR based n-value pseudo noise sequence generators by applying irreducible polynomials over the Galois Field GF(n) and realizing these with modulo-n adders, modulo-n multipliers and n-value shift registers.

It is an object of this invention to provide a method to realize prior art n-value LFSR based noise generators and others with functions and devices of this invention.

Figures 31, 32:
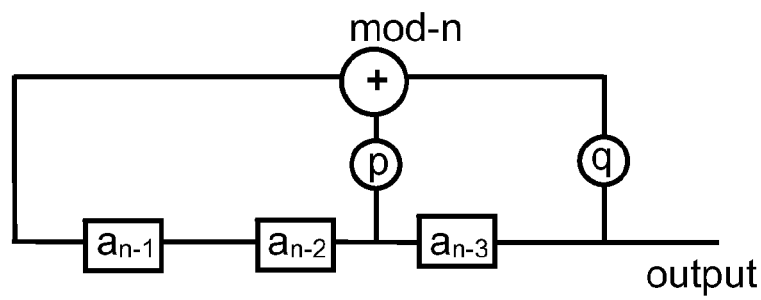
FIG. 31 shows a generic 3-stage 2-tap n-value modulo-n n-value sequence generator for which the inputs to the modulo-n adder are multiplied with factors p and q (modulo-n)
FIG. 32 shows a table with the possible inputs to a ternary device multiplied by the possible values of p and q being 1 and 2 modulo-3 (zero is considered a trivial case)

Prior art LFSR based n-value pseudo noise generators pertain to values of n which are positive integer and prime (e.g. 2, 3, 5, 7, . . . ). The realized n-value LFSR generators comprise taps containing a multiplier p at one input of the modulo-n adder and multiplier q at the other (with p and q an integer smaller than n). FIG. 31 shows an example of such a generic n-value LFSR based sequence generator.

The entities p and q are modulo-n numbers that multiply the input to the modulo-n adder with. The value of p and q can be determined from the irreducible polynomials over GF(n). If n is a prime integer then the multiplying factors (in this case p and q) are reversible inverters.

FIG. 32 shows the possible inputs to a modulo-3 adder, multiplied with 1 and 2 modulo-3. Multiplying a ternary input with 1 in ternary logic is the same as inverting the input with the identity inverter. Multiplying a ternary input with a factor 2 in ternary logic is the same as subjecting the input to the self-reversing inverter $i_2$.

Figures 33, 34:
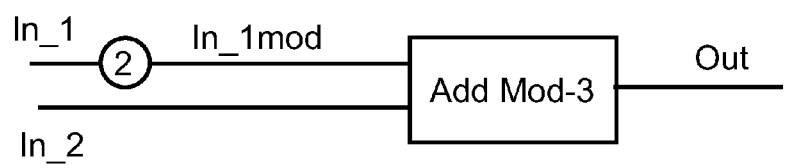
FIG. 33 shows a table with the possible inputs to a 5-value device multiplied by the possible values of p and q being 1, 2, 3 and 4 modulo-5 (zero is considered a trivial case)
FIG. 34 shows a diagram of a 2 input single output ternary device with one of its inputs multiplied with a factor 2.

FIG. 33 shows the possible inputs to a modulo-5 adder, multiplied with factors 1, 2, 3, and 4 modulo-5. In 5-value logic, multiplying the input with an integer modulo-5 is the same as subjecting the input to a reversible inverter (including the 5-value identity). In general: multiplying the input to an n-value digital device is similar to subjecting that input to an n-value digital reversible inverter.

Modifying the Truth Table by Modifying the Input to an n-Value Digital Device

Modifying the input to an n-value digital logic device, characterized by an n-value logic truth table, is the same as not modifying the input, but modifying the characterizing truth table (and thus the function) of the device. This is illustrated in FIG. 34 with a diagram of a ternary (or modulo-3) adder with inputs In_1 and In_2 and output Out. The input In_1 is multiplied by a factor 2. The inputs to the modulo-3 adder are In_1 mod and In_2. In_1 mod is created by multiplying the input In_1 with a factor 2.

Figures 35, 36:
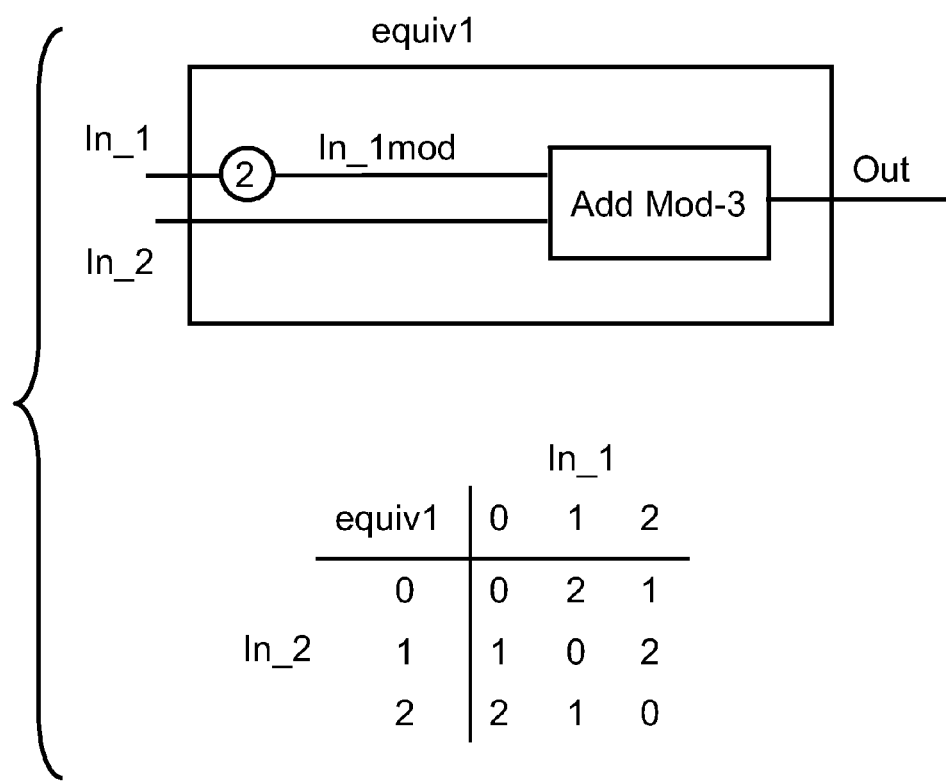
FIG. 35 shows the truth table of a modulo-3 adder.
FIG. 36 shows an equivalent depiction of the ternary device of FIG. 34 and its corresponding truth table.

FIG. 35 shows the truth table of the modulo-3 adder. The top row of the ternary truth table represents the possible values for input In_1 mod. The left column of the ternary truth table represents the possible values for input In_2.

If the input In_1 is 0 the modulo-3 adder also sees a zero, as 2×0 is 0. If the input In_1 is 1 the modulo-3 adder sees 2, which is 2×1. As a consequence we can say that instead of the column below input In_1 is 1 (adder without In_1 multiplier) it "sees" the column below In_1 mod is 2.

If the input In_1 is 2 the modulo-3 adder "sees" the column in the truth table below In_1 mod is 1. The truth table of the modulo-3 adder with the top input multiplied by a factor 2 is the same as the original modulo-3 truth table modified such that the column under In_1 mod is 1 is replaced by the column under In_1 mod is 2 and the column under In_1 mod is 2 is replaced by the column under In_1 mod is 1.

This is illustrated in FIG. 36. The original device of FIG. 34 is now replaced with the equivalent device depicted in FIG. 36 with inputs In_1 and In_2 and output Out. The corresponding truth table is also shown in FIG. 36. FIG. 36 shows the equivalent ternary logic circuit for the modulo-3 adder with the top input multiplied by a factor two and the truth table of the equivalent circuit.

Figure 37:
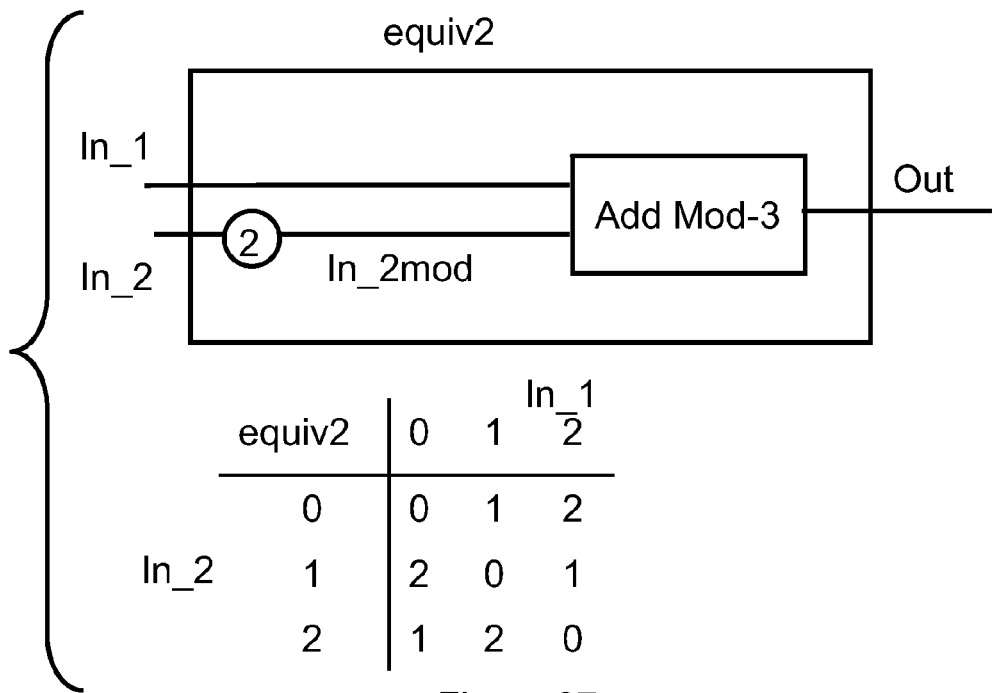
FIG. 37 shows a diagram of a modulo-3 adder with the bottom input multiplied by 2 as well as the truth table for this circuit.

FIG. 37 shows the equivalent circuit and its truth table for a modulo-3 adder with the bottom input multiplied by a factor 2. The effect of the multiplication of the bottom input by a factor 2 is the switching of the rows of In_2 is 1 and In_2 is 2.

Figure 38:
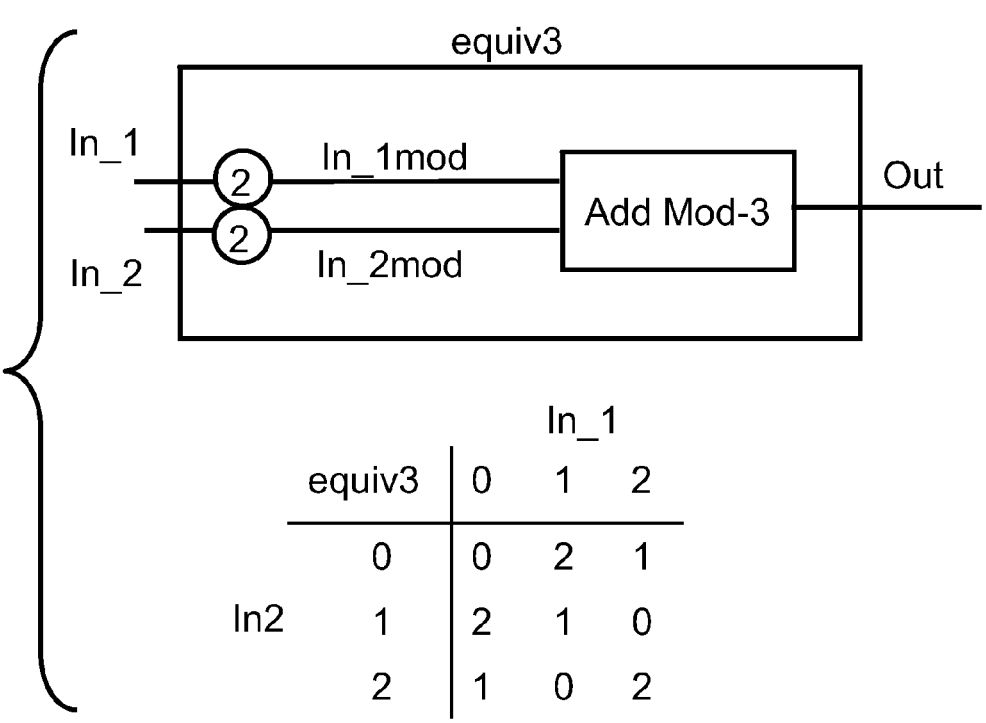
FIG. 38 shows a diagram of a modulo-3 adder with both inputs multiplied by 2 as well as the truth table for this circuit.

FIG. 38 shows the equivalent circuit and its truth table for the modulo-3 adder with both inputs multiplied by a factor 2. The effect of the multiplication of both inputs with a factor 2 is the switching of the rows In_2 is 1 and In_2 is 2 as well as the switching of the columns for In_1 is 1 and In_1 is 2.

General n-Value Inverter Method for Finding Equivalent Truth Tables and Circuits An n-value (reversible) inverter has n different elements. An n-value inverter transforms the possible input values 0, 1, 2, 3, ..., n−2, n−1 (with n a positive integer) into the possible output values: p, q, r, s ... t, u with all possible output values also being integers smaller than n, in such a way no output value is equal to another output value. The transformation is shown in the FIG. 39.

The effect of a reversible inversion on an n-value truth table is:—if the inversion is applied to the top input the column under input is 0 is replaced with the column under input is p, the column under input is 1 is replaced by the column under input q, the column under input is 3 is replaced by the column under input is s. Up to the column under input is (n−1) is replaced by the column under input is u.

If the inversion is applied to the bottom input, the same rules are applied to the rows of the truth tables. If an inversion is applied to both inputs, the above rules apply to columns and rows, and are not dependent on the order of execution.

This method fulfills the object of the invention to create n-value digital logic functions and circuits that can generate not only n value signal sequences, but also all sequences that can be created with prior art but with fewer component functions applied, as this makes the multipliers obsolete.

In ternary logic, 5 different reversible inverters exist that are different from identity. But there is just one modulo-3 multiplication not equal to 0 or 1. Consequently the inverter based method can generate more different functions than modulo-3 arithmetic and provide a much greater diversity in functions and devices than prior art applying modulo-3 arithmetic.

The same reasoning and diversity advantage applies to higher value generation of sequences.

The Ternary LFSR Sequence Generators

The literature describes a 3-value digital PN generator to be a LFSR able to contain 3-valued numbers with feedback taps into modulo-3 adders. The feedback taps contain modulo-3 multipliers. The behavior of the ternary pseudo noise generator is determined by the number of taps and the values in the multipliers. Literature and prior art describe how to apply irreducible polynomials to design n-value noise generators.

Figures 39, 40:
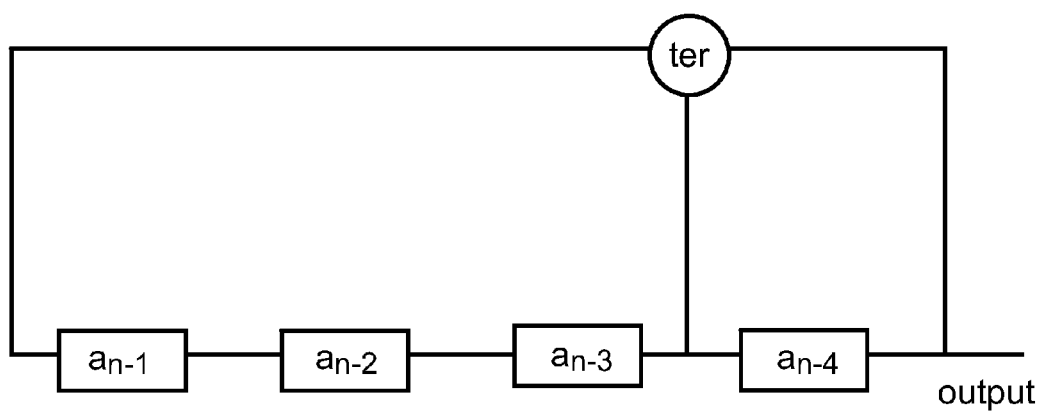
FIG. 39 shows a table of transformation for an n-value reversible inverter.
FIG. 40 shows a diagram of a one ternary function LFSR based sequence generator.
Figure 41:
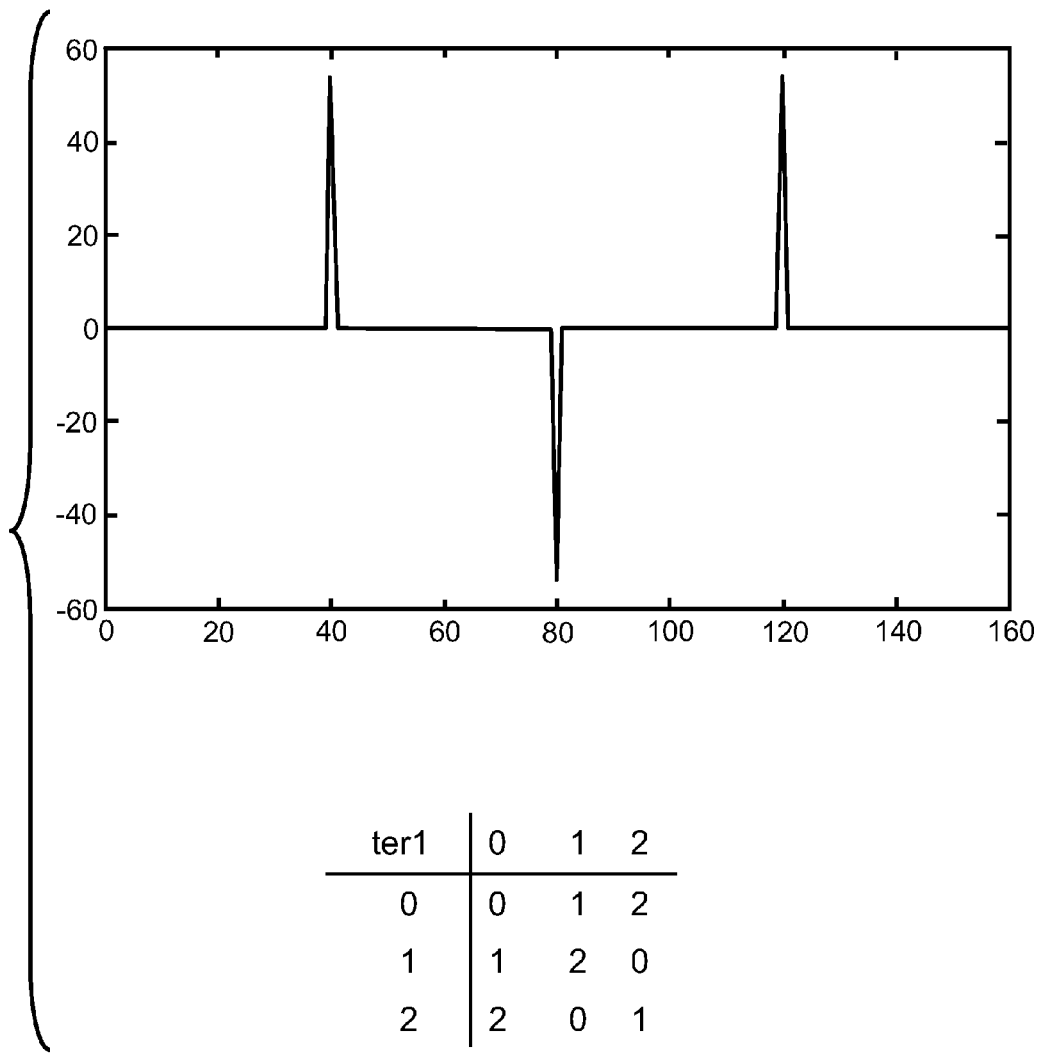
FIG. 41 shows the truth table of ternary reversible function 'ter1' applied in the lay-out of the ternary sequence generator as shown in FIG. 40, as well as a graph showing the auto-correlation for the generated sequences.
Figure 42:
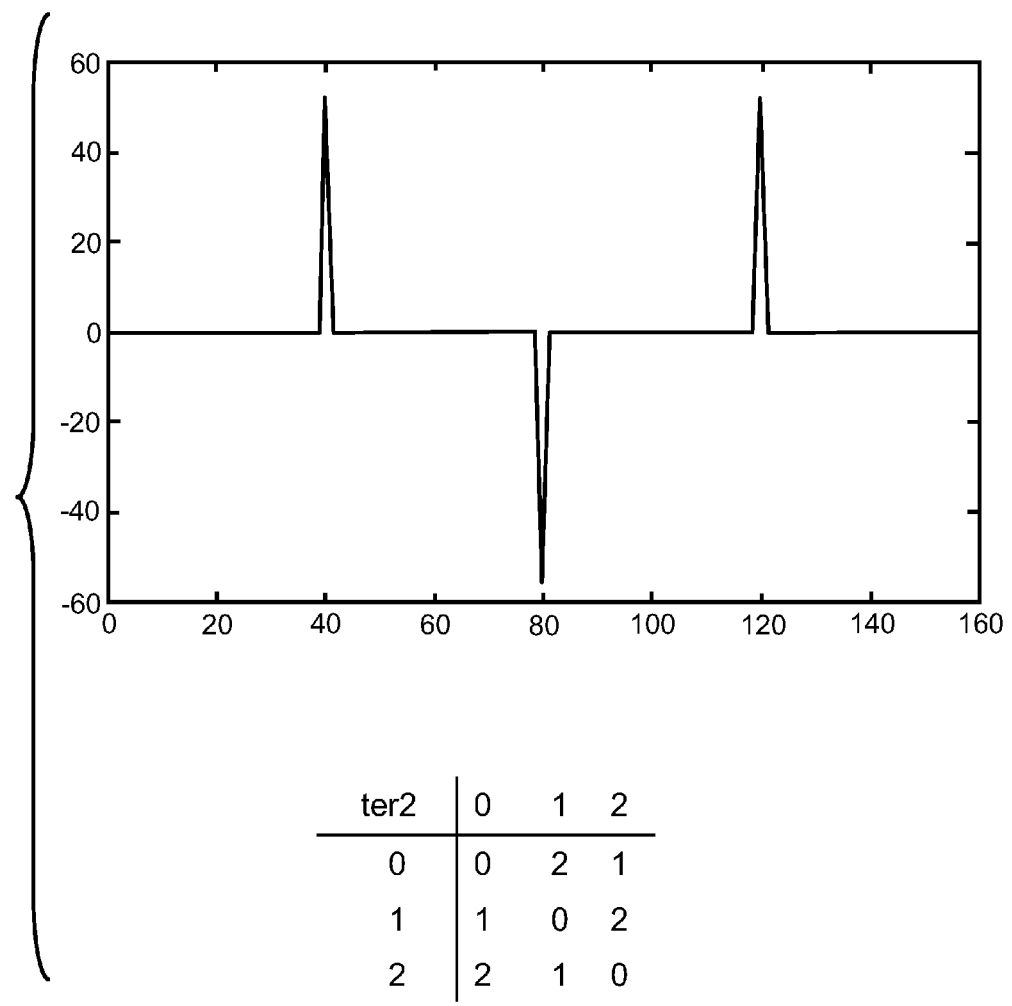
FIG. 42 shows the truth table of ternary reversible function 'ter2' applied in the lay-out of the ternary sequence generator as shown in FIG. 40, as well as a graph showing the auto-correlation for the generated sequences.
Figure 43:
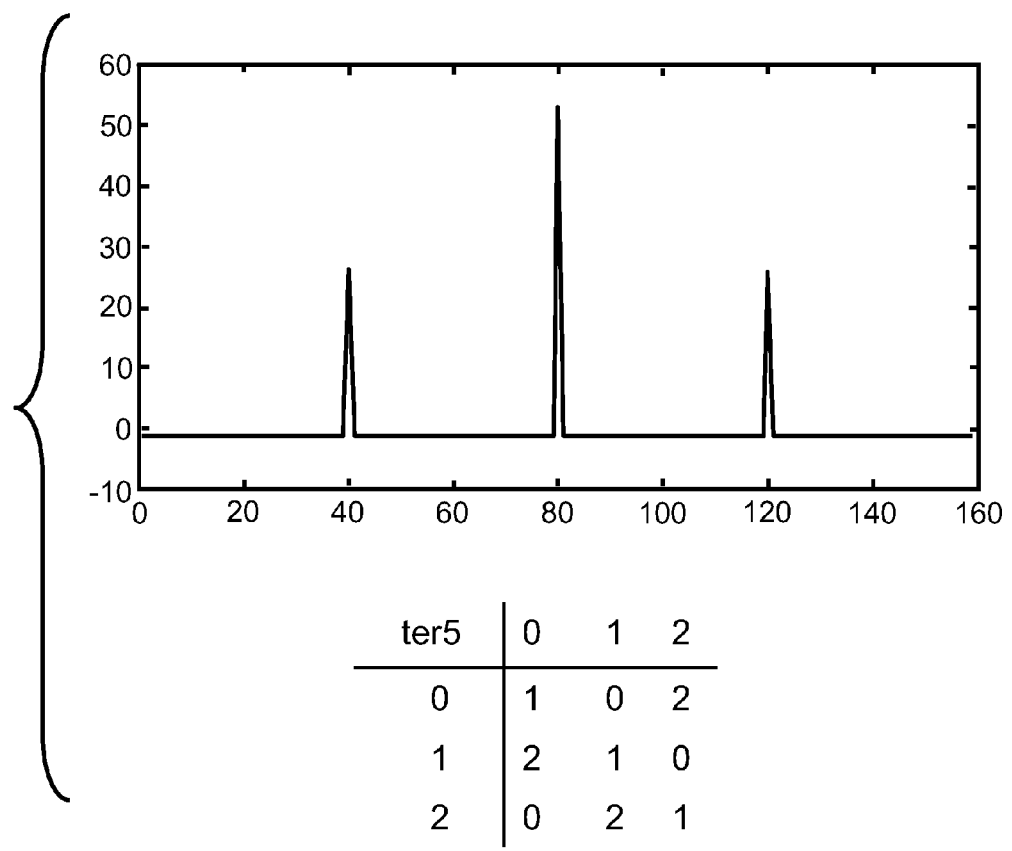
FIG. 43 shows the truth table of ternary reversible function 'ter5' applied in the lay-out of the ternary sequence generator as shown in FIG. 40, as well as a graph showing the auto-correlation for the generated sequences.
Figure 44:
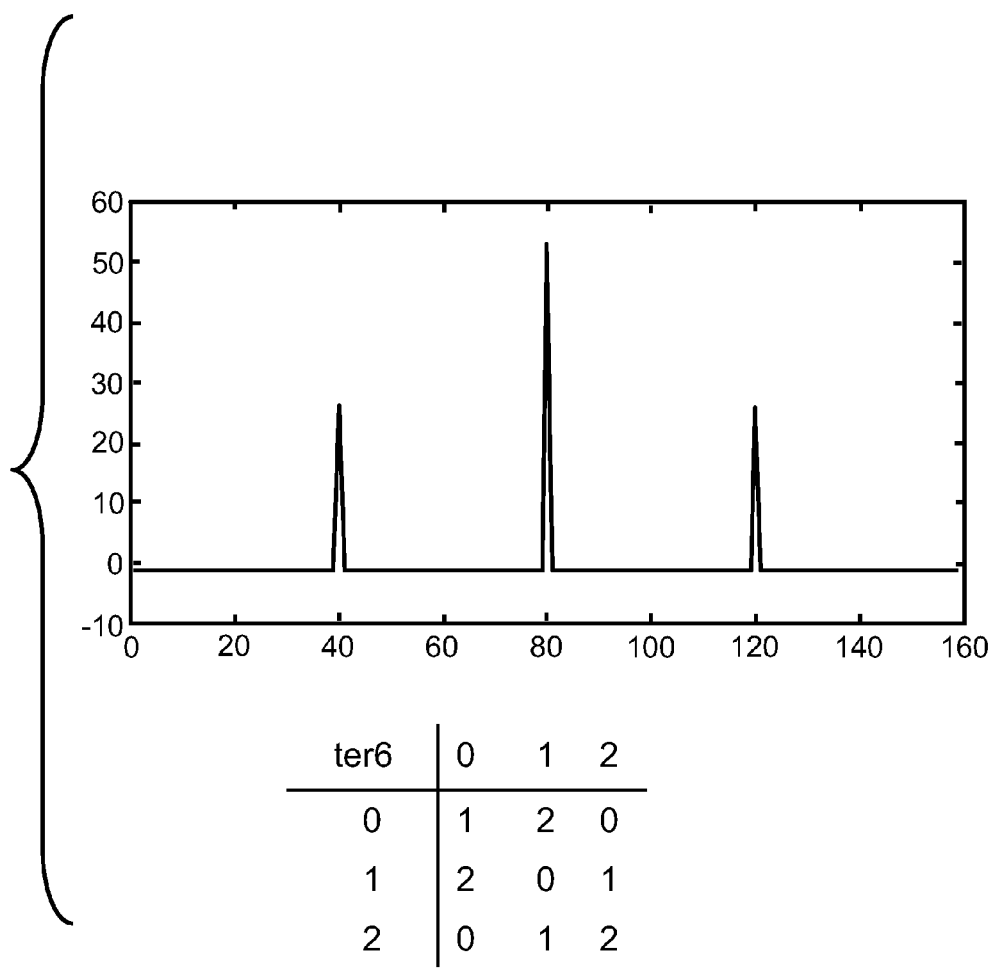
FIG. 44 shows the truth table of ternary reversible function 'ter6' applied in the lay-out of the ternary sequence generator as shown in FIG. 40, as well as a graph showing the auto-correlation for the generated sequences.
Figure 45:
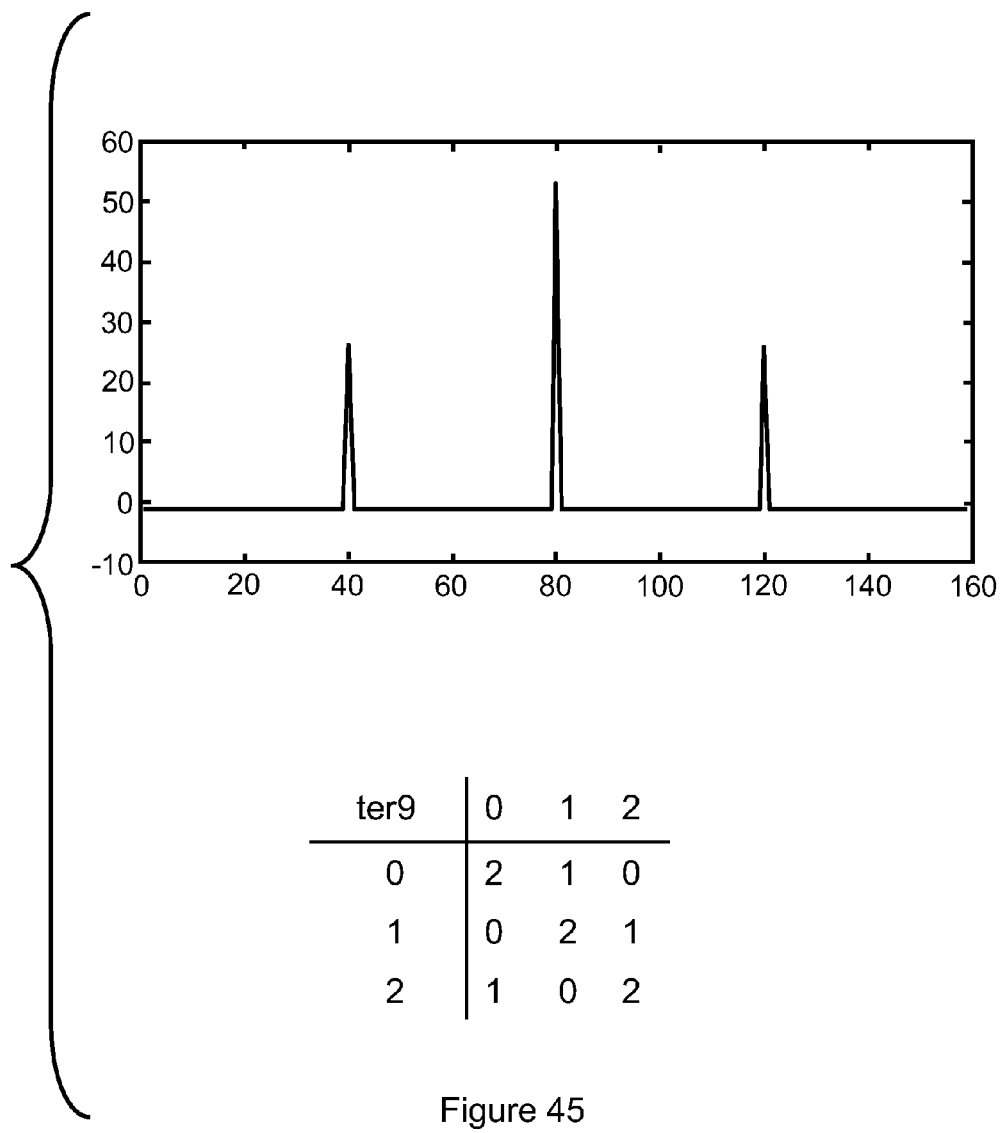
FIG. 45 shows the truth table of ternary reversible function 'ter9' applied in the lay-out of the ternary sequence generator as shown in FIG. 40, as well as a graph showing the auto-correlation for the generated sequences.

One aspect of the present invention comprises ternary or 3-value sequence generators formed from a 3-valued shift register with feedback taps leading into connecting devices which have describing ternary truth tables comprised of columns or rows which are selected from the set of 6 reversible ternary inverters. A ternary sequence generator can be any of the possible ternary LFSR scramblers with no input and the connecting device between LFSR signal and input signal being replaced by a short circuit. FIG. 40 shows an example of such a ternary PN generator.

Several terminals can be selected for collecting the 'output' signal. In fact any of the inputs or outputs of the elements of the shift register will do. The 'output' on these terminals will differ on the first output signals as the shift register is being flushed. In general the initial state should be such that transitions will be generated.

The two irreducible polynomials for a 4-stage LFSR based ternary PN generator with two feedback taps as shown in FIG. 40 are: $(x^4+x+2)$ and $(x^4+2x+2)$. Literature says that these two (modulo-3 adder based) solutions are able to generate what is known in prior art as ternary m-sequences.

The performance or desirability of a sequence is frequently measured by correlation and autocorrelation. Auto-correlation and cross-correlation are important indicators of certain qualities of digital sequences. The subject of auto-correlation is well documented. Correlation is usually calculated between two sequences. In auto-correlation the second sequence is a copy of the original one.

In principle, correlation of two sequences of equal lengths (assume length is n elements) is calculated by multiplying the assigned value of the $k^{th}$ element of the first sequence with the assigned value of the $k^{th}$ element of the second sequence. This multiplication is done for all n elements of both sequences. The result of these multiplications is added into one sum. This sum is then called the correlation value. In general, the correlation between two sequences is calculated for all time shifted instances of one of the sequences. If the length of the sequences is n elements, there will be 2n−1 different matches between two sequences of length n.

The graph that displays the 2n−1 correlation values between the two sequences is in general called the auto-correlation graph (if the two sequences are equal) or the cross-correlation graph if the correlation is determined between two different sequences of equal length.

M-sequences or maximum length sequences in the binary case are sequences that have an autocorrelation value A in all time shifted calculations and a value B when a sequence is correlated with a non-shifted copy of itself. The value of A and B depends on the assigned value to the binary elements. In case of a balanced assigned value (say 0 is assigned the value −1 and 1 is assigned the value +1) the value of A can be 0. It is well known that sequences with certain auto- and cross-correlation have attractive properties. One aspect of this invention determines configurations to generate ternary and n-value sequences with m-sequence like properties. It is possible to normalize correlation calculations for n-value sequences with n an integer greater than 2. In general, for calculating correlation properties of an n value digital signal will be considered having the values: 0, 1, 2, 3, ..., n−1. For calculating the correlation, these values will be used or these values will be substituted so they are balanced around 0, (for instance by subtracting (n−1)/2 of all values if n is odd; and by substituting the first n/2 states with −(n/2)+i for i=0, 1, ... (n/2−1) and the next n/2 states with i−(n/2−1) for i=n/2, ..., n−1 if n is even). The above type of substitution does affect the individual correlation values but not the shape of the correlation graph. However, the substitution can also reflect use of different reversible inverters. This can change the overall shape of the correlation graph, mainly the orientation of some of the peak values in the correlation graph as being above or below the average line.

One measure for the performance or desirability of a sequence is its autocorrelation. The modulo-3 adder with multipliers provides 2 configurations for generating m-sequences based on the irreducible polynomial in the lay-out of FIG. 40. The application of reversible ternary functions can provide at least 6 different configurations under the lay-out of FIG. 40 that will generate m-sequences. This invention in general provides greater diversity with fewer components to generate attractive n-value digital sequences.

FIGS. 41, 42, 43, 44, 45 and 46 show the truth tables of the applied different ternary devices in the lay-out of the sequence generator as in FIG. 40 for the LFSR based ternary m-sequence generator and a graph of the auto-correlation of the generated sequences.

The autocorrelation graphs show that applying the functions ter1, ter2, ter5, ter6, ter9 and ter10 in the ternary 4 stage LFSR with taps on the output of the $3^{rd}$ and $4^{th}$ element creates sequences with attractive properties. One reason they are attractive is because they will make it easier to determine synchronization. Analysis of the sequences will show that the shifted sequences are not equal to each other. This indicates that the thus generated individual shifted sequences also have very attractive orthogonal properties.

Figure 47:
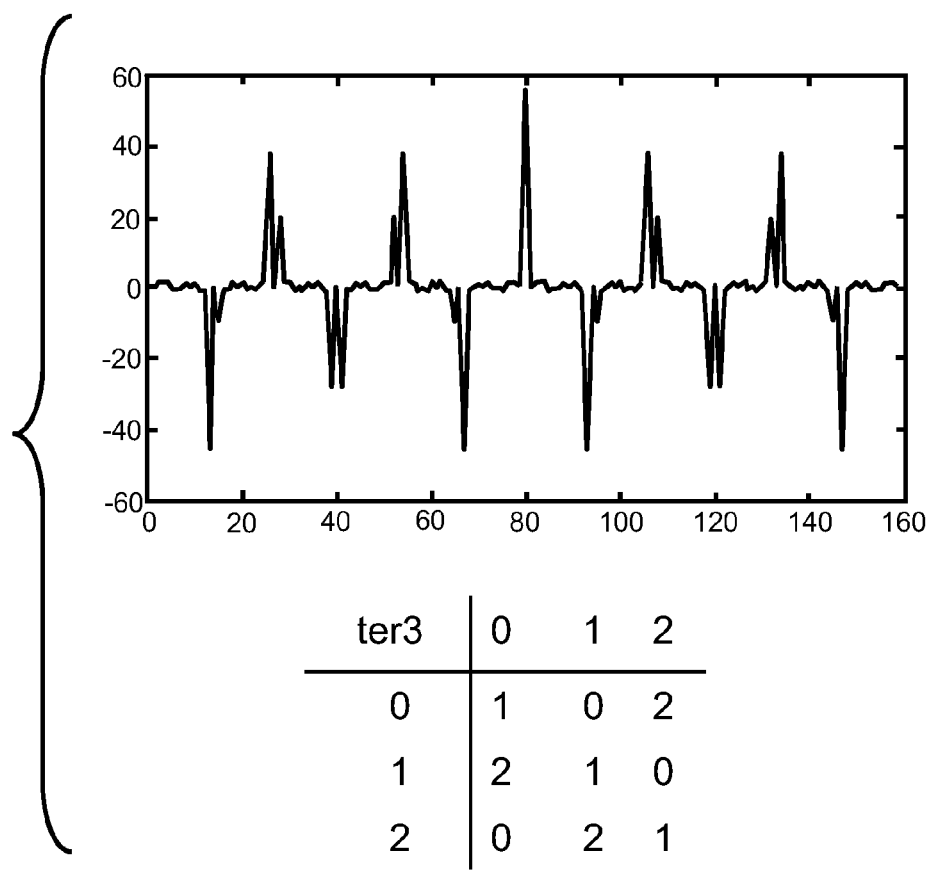
FIG. 47 shows the truth table of ternary reversible function 'ter3' applied in the lay-out of the ternary sequence generator as shown in FIG. 40, as well as a graph showing the auto-correlation for the generated sequences.

For illustration purposes, FIG. 47 showing the autocorrelation and truth table for the above sequence generator ter3 has been included. The application of this function demonstrates much less attractive properties. This is because it will be difficult to detect a peak value where synchronization occurs.

The n-Value Digital Sequence Generators

The above reasoning can be extended to all multi-value or n-value (with n an integer greater than two) linear feedback shift register based digital sequence generators.

Thus, one aspect of the present invention provides a n-value (with n an integer greater than 2) sequence generators formed from n-value Linear Feedback Shift Registers with a maximum number of n feedback taps connected by n-value logic function devices of which the truth tables are constructed from n-value reversible inverters. These systems have no input signal. The resulting feedback is directly guided to the first stage of the shift register.

The inventor has tested the sequences generated by the different configurations depicted in FIGS. 41, 42, 43, 44, 45 and 46. While the sequences generated by each configuration are time shifted, the sequences of each configuration are totally different from the sequences generated by the other configurations. Consequently this invention can generate a greater set of m-sequences than prior art by nature of its greater set of connecting multi-value functions or devices than in prior art.

Exceptions to this invention are any LFSR system that contains only modulo-n adding devices as two-input connectors in LFSR based sequence generators. These modulo-n adding devices based systems are prior art.

Adjusting Auto-Correlation and Cross-Correlation of Sequences

The auto-correlation of an n-value digital sequence can be considered to be cross-correlation between this sequence and a time shifted version of this sequence. It is useful to have a cross-correlation or auto-correlation that is zero over as large a period as possible.

Figure 46:
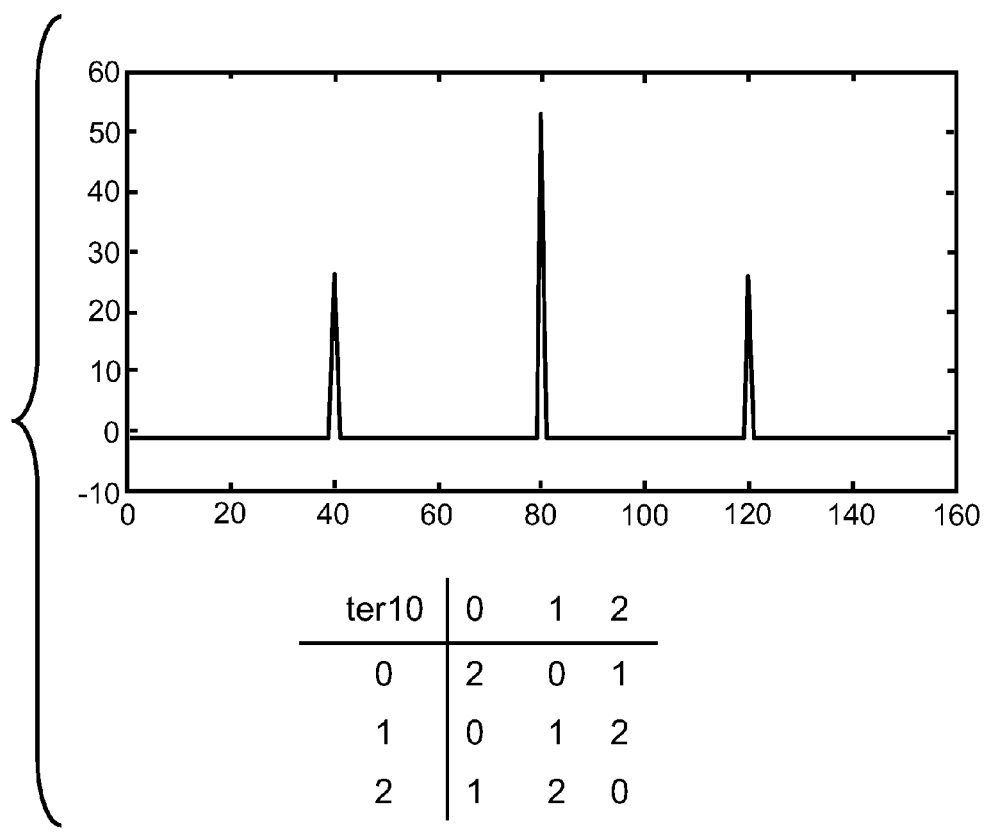
FIG. 46 shows the truth table of ternary reversible function 'ter10' applied in the lay-out of the ternary sequence generator as shown in FIG. 40, as well as a graph showing the auto-correlation for the generated sequences.

The ternary LFSR based sequence generator as shown in FIG. 46 applying ternary function 'ter10' has an auto-correlation value of −1 over a large area, with low peaks with value 26 at n=40 and n=120 and a large peak of value 53 at n=80.

It would be useful to be able to change the auto-correlation such that is has just one positive peak for synchronization. It would also be very beneficial if the cross-correlation between time shifted sequences could be made 0 (which means that these sequences are orthogonal).

By applying ternary inverter $i_3$ as shown in the table of reversible ternary inverters in FIG. 11 to the sequence after generating the sequence but before determining the auto or cross correlation, the correlation is adjusted to 0 over the majority of the sequence period. Further, the peak value is adjusted to −54 at n=40 and at n=120 and to +54 at n=80.

Figure 48:
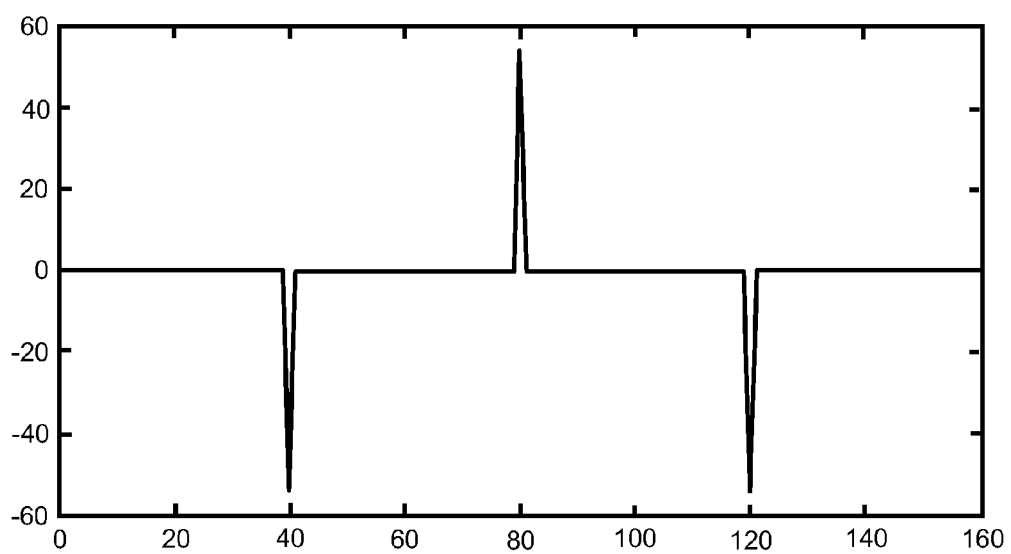
FIG. 48 shows a graph of the auto-correlation of a sequence generated by an LFSR based ternary sequence generator with the lay-out of FIG. 40 applying the ternary function ter10 and applying ternary inverter i3 as shown in the table of reversible ternary inverters in FIG. 11.

FIG. 48 shows a graph of the adjusted auto-correlation for the LFSR based ternary sequence generator with lay-out as in FIG. 40 with device 'ter10' and applying ternary reversible inverter $i_3$ to the sequence before determining the correlation.

In accordance with another aspect of the present invention, the level of the cross-correlation of two n-value digital sequences can be adjusted by applying one or more similar or different n-value inverters to each sequence before determining the cross-correlation.

In accordance with a further aspect of the present invention, the level of the auto-correlation of an n-value digital sequence can be adjusted by applying one or more similar or different inverters to the sequence before determining the auto-correlation. The auto-correlation is determined by shifting the original n-value sequence in time (or phase) and calculating the correlation between the original and shifted n-value sequence. Appropriate adjustment can be achieved by applying similar or different inverters to the original and its shifted sequences.

Consequently the invention does not only provide a greater diversity in creating sequence generators it also provides better ways to make use of them.

PREFERRED EMBODIMENT OF THE N-VALUE DIGITAL SCRAMBLERS DESCRAMBLERS, INVERTERS AND SEQUENCE GENERATORS

As many apparently different embodiments of this invention may be made without departing from the spirit and scope thereof, it is to be understood that the invention is not limited to the specific embodiments thereof.

One embodiment of the execution of the multi-value scrambling, descrambling and sequence generators is by way of programmable Digital Signal Processors (DSPs). In such an embodiment the incoming multi-value digital signal (in case of a scrambler or descrambler) can be translated by an A/D converter into binary representation and read into the DSP. The DSP can be programmed to execute the scrambling, descrambling and signal generating functionality in binary form and apply a D/A converter to create the multi-value digital output signal.

Another embodiment of the execution of the multi-value scrambling, descrambling and signal generating functionality is by way of binary logic and binary or hybrid memory elements. Multi-value digital signal inputs can be translated through an A/D converter into binary representation. The ternary and multi-value logic functions can be contained in electronic memory devices in such a way that the binary representation of the input signals form the addresses of memory locations. The content of the memory devices at these locations then form the result of the truth table representing the ternary and multi-value logic functions, also in binary form. The content of the specific memory address location can be used for further processing or can be translated from binary form into a ternary or multi-value signal by using a D/A converter. Consequently multi-value shift registers in LFSR applications can be either clocked binary memory devices. They can also be analog or hybrid devices where the content of a memory location is a physical entity (such as electrical charge) representative of the value of a ternary or multi-value signal.

Another embodiment of the execution of the multi-value scrambling, descrambling and signal generating functionality is by way of complete discrete binary logic.

A new embodiment of ternary and multi-value scrambling, descrambling and signal sequence generating execution is the application of existing and emerging ternary and multi-value electronic logic circuits either in CMOS or otherwise.

A method to design the embodiment in ternary and multi-value electronic form is part of this invention. It is shown for ternary logic but can easily be visualized in any higher value logic.

Figure 49:
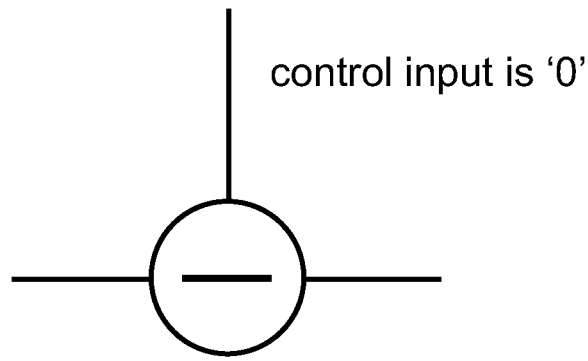
FIG. 49 shows a diagram of a conducting gate with the control input equal to '0'.
Figure 50:
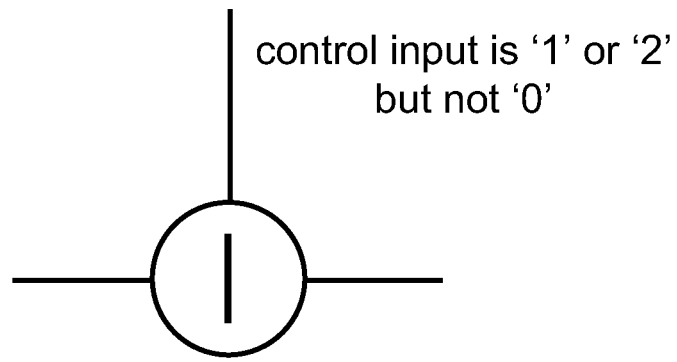
FIG. 50 shows a diagram of a non-conducting gate with the control input not equal to '0'.

The object is to realize any ternary two inputs/single output truth table in ternary logic. The assumption is that the following two electronic elements are available: The first element is an electronic gate that conducts a current if a control input has a value equivalent to a state '0'. The gate is non-conducting for all other control values. This gate is shown in conducting state in FIG. 49 and in non-conducting state in FIG. 50. It is assumed that the gate is direction sensitive and should be read from left to right.

The second element is a universal ternary inverter equivalent to ternary inverter $i_4$ or $i_5$. Applying inverter $i_4$ twice acts like applying $i_5$. Applying ternary inverter $i_5$ twice acts like applying ternary inverter $i_4$ once. Applying inverter $i_4$ followed by inverter $i_5$ is the same as identity. Applying inverter $i_5$ followed by inverter $i_4$ is also like applying identity. Also applying $i_4$ three times as well as applying $i_5$ three times is equal to identity.

FIG. 51 shows the result of applying ternary reversible inverter $i_4$ twice. FIG. 52 shows the effect of applying ternary reversible inverter $i_5$ twice.

The number columns between the vertical lines in FIG. 51 and FIG. 52 represent possible states before and after inversion. It should be clear that by applying one inverter once or twice each initial ternary state can be transferred to each desirable other ternary state.

With the gate and universal ternary inverter ($i_4$ or $i_5$) as only available components (but in unlimited amounts), every possible ternary two-input single output device can be realized. To demonstrate this, the ternary truth table shown in FIG. 53 will be realized in diagram by applying the gate/universal inverter method.

Figure 54:
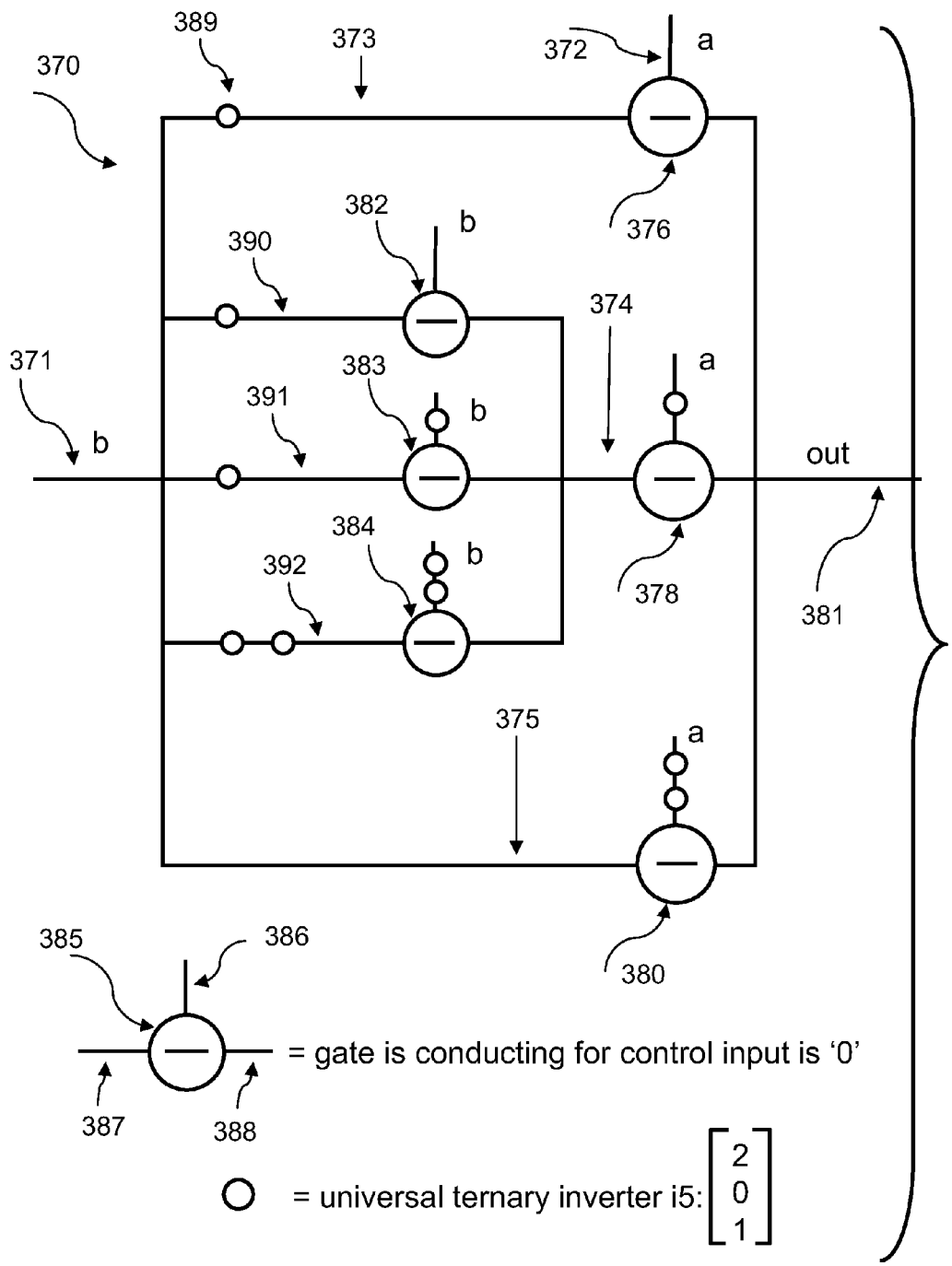
FIG. 54 shows a diagram of a ternary device realizing the truth table of FIG. 53 with the gate/universal ternary gate method.

FIG. 54 shows a diagram of a device realizing the ternary truth table exclusively with the gate and ternary universal inverter $i_5$ as components. The electronic device 370 has two inputs 371 and 372. The signal b is input to the first input 271 and the signal a is input to the second input 372. The electronic device 370 also has three channels 373, 374 and 375.

Each channel in this case corresponds with the realization of a column of the truth table. The empty circles indicate the inverter $i_5$. The circle 385 with a line inside shows a gate controlled by an input 386. If the state of the control input to the gate 385 is 0, then the gate is conducting and signals are passed from the input 387 to the output 388. If the state of the control input to the gate 385 is not 0, then the gate 385 is not conducting and no signals are conducted from the input 387 to the output 388.

The electronic device 370 also has an output 381.

If a=0, then state 0 is applied to gate 376 so that gate 376 is enabled so that the first channel 371 conducts, and input 371 is connected to output 381. In this case, gates 378 and 380 have a non-0 state applied from the input signal "a" at input 372. In case of gate 378, the input state 0 is provided to the input of the inverter $i_5$ in the control input of gate 378. The inverter transforms the provided input state to the state 2 which is the control input state to the gate 378, which is thus not conducting. In the case of gate 380, the input state 0 is provided to the input of the first inverter $i_5$ in the control input of gate 380. The inverter transforms the provided input state to the state 2 which is then the input state to the second inverter $i_5$ in the control input of gate 380. The second inverter transforms the provided input state 2 to the state 1 which is then the input state to the control input of gate 380, which is thus not conducting. Thus, the channels 374 and 385, respectively, do not conduct, and cannot contribute to the signal at output 381. Only signals through channel 373 contribute to the output signal at output 381.

A signal coming from input 371 going through 378 to output 381 is transformed by the inverter $i_5$ 389 in its path. So if a=0 and b=0 then the state of the signal b=0 is transformed to state 2 and output 381 assumes the state 2. If a=0 and b=1 then the state of the signal b=1 is transformed to state 0 and output 381 assumes the state 0. If a=0 and b=2 then the state of the signal b=2 is transformed to state 1 and output 381 assumes the state 1. These states represent the first column of the truth table of the ternary logic function 'ternary' as shown in FIG. 53.

If a=1, then only gate 378 conducts. Gates 376 and 380 are non-conducting. Then one of the gates 382, 383 or 384 will conduct, depending on the value of the input b. If b=0, then gate 382 will conduct and the subchannel 390 is conducting. Subchannels 391 and 392 are non-conducting. The signal representing b=0 will be inverted by inverter $i_5$ in subchannel 390, and the output will be 2. If b=1, then gate 383 will conduct and subchannel 391 is conducting. In this case, subchannels 390 and 392 are non-conducting. The signal representing b=1 will be inverted by inverter i5 in subchannel 391 and the output will be 0. If b=2 then gate 384 will conduct and the subchannel 392 will be conducting. Subchannels 390 and 392 will be non-conducting. The signal representing b=2 will be inverted twice by the inverters $i_5$ in subchannel 392, first from 2 to 1 and then from 1 to 0 and the output will be 0. The output states represent the second column of the truth table of the ternary logic function 'ternary' as shown in FIG. 53.

If a=0 then only gate 380 conducts. Gates 376 and 378 are non-conducting since a non-zero value is applied to the control input of these gates as a result of the input a. In this case, the output of the electronic device 370 is 0 when the input b is 0, 1 when the input b is 1 and 2 when the input b is 2. These states represent the third column of the truth table of the ternary logic function 'ternary' as shown in FIG. 53.

Similar embodiments with components employing a gate that conducts if the control input is '0' and a reversible n-value inverter would be able to realize any n-value digital logic function. Thus, any of the n-value logic functions defined herein can be constructed.

The reduction of combinations of n-valued inverters at inputs of n-valued logic functions have been disclosed in accordance with one aspect of the present invention. Examples have been provided and FIGS. 31-38 highlight elements of the reduction. The methods as provided apply to all n-valued 2 input/single output functions. They will also apply in essence to functions with more than 2 inputs. The method has been demonstrated for any n>2 and any GF(n). In general the reduction method will be used for LFSRs which initially may be derived from irreducible polynomials over GF(n). It has been shown as another aspect of the present invention that LFSRs can use reversible n-valued logic functions that can not readily be derived from such polynomials. The truth tables of functions may be created from n-valued reversible inverters as rows and/or columns of the truth table.

Appropriate n-valued logic functions for LFSRs cannot be created from truth tables of modulo-n adders (which are reversible) with modulo-n multipliers if n can be factorized, such as n=4, n=6, n=9, etc, or in other words if n is not prime. A known method to create a field over GF(n) if n is not prime, but n=$u^p$, wherein u is a prime number and p≥2, is to create an extended field GF($u^p$). It is known that in order to define an extended field GF($u^p$) one will use a primitive polynomial over GF($u^p$) to define the extended field. Within the extended field a reversible multiplication exists and a reversible addition. According to the method explained earlier, the constant multipliers in GF($u^p$) can be considered as n-valued reversible inverters with n=$u^p$. Accordingly the constant multipliers at inputs of an addition in GF($u^p$) can be reduced to a single reversible n-valued logic function, wherein the truth table of the addition over GF($u^p$) is modified according to n-valued inverters representing the multipliers over GF($u^p$) at the inputs of the addition function. This means that an expression z=(r×x)+(q×y) wherein × is a multiplication over GF($u^p$) and + is an addition over GF($u^p$), r and q are n-valued constants and x and y are n-valued variables, can be replaced by an expression z=x sc4 y, wherein sc4 is a n-valued logic function. The truth table of sc4 can be created by modifying the truth table of + according to the n-valued inverter representing (r×x) and the n-valued inverter representing (q×y). Inverters (r×x) and (q×y) are commutative.

An illustrative example will be provided for GF($2^2$). Assume the expression z=(2×x)+(3×y) over GF($2^2$). This can be replaced by the expression z=(x sc4 y). The following tables provide the truth tables of addition + and multiplication × over GF($2^2$), as well as the truth table of sc4.

| + | 0 | 1 | 2 | 3 | × | 0 | 1 | 2 | 3 | sc4 | 0 | 1 | 2 | 3 |
|---|---|---|---|---|---|---|---|---|---|-----|---|---|---|---|
| 0 | 0 | 1 | 2 | 3 | 0 | 0 | 0 | 0 | 0 | 0   | 0 | 3 | 1 | 2 |
| 1 | 1 | 0 | 3 | 2 | 1 | 0 | 1 | 2 | 3 | 1   | 2 | 1 | 3 | 0 |
| 2 | 2 | 3 | 0 | 1 | 2 | 0 | 2 | 3 | 1 | 2   | 3 | 0 | 2 | 1 |
| 3 | 3 | 2 | 1 | 0 | 3 | 0 | 3 | 1 | 2 | 3   | 1 | 2 | 0 | 3 |

It should be clear that the function reduction can be performed for any expression z=(r×x)+(q×y) over any extended field GF($u^p$) with $u^p$>2, u≥2 and p≥1. The situation $u^p$=2 is the binary case. The solution for either r=0 or q=0 is trivial. The solution for r=1 provides z=x+(q×y), which will have a function sc4 created by modifying the +truth table according to (q×y) and q=1 will provide z=(r×x)+y, which will have a function sc4 created by modifying the + truth table according to (r×x).

In view of the above description of the present invention, it will be appreciated by those skilled in the art that many variations, modifications and changes can be made to the present invention without departing from the spirit or scope of the present invention as defined by the claims appended hereto. All such variations, modifications or changes are fully contemplated by the present invention.

While the invention has been described with reference to an illustrative embodiment, this description is not intended to be construed in a limiting sense. For example, while the disclosed embodiments utilize discrete devices, these devices can be implemented using one or more appropriately programmed processors, special-purpose integrated circuits, digital processors, or an analog or hybrid counterpart of any of these devices.

The invention claimed is:

1. A device to generate on an output an n-state symbol, the n-state symbol having one of n states with n>2 and the n-state symbol being represented by a signal, comprising:
a first input and a second input to a memory, each input enabled to receive a signal representing a first and a second n-state symbol each provided by an n-state shift register;
the memory storing a non-commutative n by n n-state truth table not being a modulo-n subtraction; and
an output of the memory to provide a signal representing the n-state symbol in accordance with the non-commutative n by n truth table.

2. The device of claim 1, wherein n>3.

3. The device of claim 1, wherein the non-commutative n by n truth table represents a truth table of an addition over a finite field GF(n) modified in accordance with an n-state multiplication over GF(n).

4. The device of claim 1, wherein the non-commutative n by n truth table represents a commutative n by n truth table modified in accordance with an n-state inverter.

5. The device of claim 1, wherein the device is part of a scrambler.

6. The device of claim 1, wherein the device is part of a descrambler.

7. The device of claim 6, wherein the descrambler is self-synchronizing.

8. The device of claim 1, wherein the device is part of a generator of a sequence of n state symbols.

9. The device of claim 8, wherein the sequence is a maximum-length sequence.

10. The device of claim 1, wherein an n-state symbol is represented by a plurality of binary signals.

11. The device of claim 1, wherein the device is part of a communication system.

12. A method to generate with a processor an n-state symbol as part of processing a sequence of n-state symbols, each n-state symbol having one of n states with n>2 and being represented by a signal, comprising:
the processor storing on a memory device in a coder a non-commutative n by n n-state truth table not being a modulo-n subtraction;
the processor inputting on a first input of the memory device a signal representing a first n-state symbol;
the processor inputting on a second input of the memory device a signal representing a second n-state symbol; and
outputting on an output of the memory device a signal representing the n-state symbol generated in accordance with the non-commutative n by n n-state truth table.

13. The method of claim 12, wherein n>3.

14. The method of claim 12, wherein the non-commutative n by n n-state truth table represents a truth table of an addition over a finite field GF(n) modified in accordance with an n-state multiplication over GF(n).

15. The method of claim 12, wherein the non-commutative n by n n-state truth table represents a commutative n by n truth table modified in accordance with an n-state inverter.

16. The method of claim 12, further comprising:
processing the n-state symbol in a Linear Feedback Shift Register (LFSR).

17. The method of claim 12, further comprising:
processing the n-state symbol in a descrambler.

18. The method of claim 12, wherein the n-state symbol is generated in a sequence generator.

19. The method of claim 12, wherein the n-state symbol is generated in a communication system.

20. The method of claim 12, wherein the n-state symbol is represented by a plurality of binary symbols.

* * * * *

UNITED STATES PATENT AND TRADEMARK OFFICE
CERTIFICATE OF CORRECTION

PATENT NO. : 8,589,466 B2  
APPLICATION NO. : 13/027387  
DATED : November 19, 2013  
INVENTOR(S) : Peter Lablans Page 1 of 1

It is certified that error appears in the above-identified patent and that said Letters Patent is hereby corrected as shown below:

Title page, item [54] and In the Specifications, Column 1, title should read as follows:

Ternary and Multi-Value Digital Signal Scramblers, Descramblers and Sequence Generators Signed and Sealed this
Eighteenth Day of March, 2014

Michelle K. Lee
*Deputy Director of the United States Patent and Trademark Office*